(12) United States Patent
Marakhtanov et al.

(10) Patent No.: US 10,115,564 B2
(45) Date of Patent: *Oct. 30, 2018

(54) UNIFORMITY CONTROL CIRCUIT FOR USE WITHIN AN IMPEDANCE MATCHING CIRCUIT

(71) Applicant: Lam Research Corporation, Fremont, CA (US)

(72) Inventors: Alexei Marakhtanov, Albany, CA (US); Felix Kozakevich, Sunnyvale, CA (US); Kenneth Lucchesi, Newark, CA (US); John Patrick Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/682,164

(22) Filed: Aug. 21, 2017

(65) Prior Publication Data

US 2017/0372872 A1    Dec. 28, 2017

Related U.S. Application Data

(62) Division of application No. 14/878,666, filed on Oct. 8, 2015, now Pat. No. 9,761,414.

(51) Int. Cl.
*H01J 37/00* (2006.01)
*H01J 37/32* (2006.01)

(52) U.S. Cl.
CPC .. *H01J 37/32091* (2013.01); *H01J 37/32449* (2013.01); *H01J 37/32532* (2013.01); *H01J 2237/334* (2013.01)

(58) Field of Classification Search
CPC ........... H01J 37/32183; H01J 37/32357; H01J 37/3244; H01J 2237/3321; H01J 2237/335
USPC .............. 315/111.21, 111.91, 111.01, 111.71
See application file for complete search history.

(56) References Cited

U.S. PATENT DOCUMENTS

| 7,421,973 | B2 * | 9/2008 | Kellerman | H01J 37/08 |
| | | | | 118/723 CB |
| 8,168,957 | B2 * | 5/2012 | Keller | H01J 27/16 |
| | | | | 156/345.48 |
| 2002/0038688 | A1 * | 4/2002 | Nakano | C23C 16/5096 |
| | | | | 156/345.12 |
| 2003/0097984 | A1 * | 5/2003 | Nakano | H01J 37/32082 |
| | | | | 118/712 |

(Continued)

*Primary Examiner* — Douglas W Owens
*Assistant Examiner* — Syed M Kaiser
(74) *Attorney, Agent, or Firm* — Martine Penilla Group, LLP

(57) ABSTRACT

An impedance matching circuit (IMC) is described. The IMC includes a first circuit that includes a first plurality of tuning elements defined along a path. The first circuit has an input coupled to a kilohertz (kHz) radio frequency (RF) generator. The first circuit is coupled to an output. The IMC further includes a second circuit having a second plurality of tuning elements. The second circuit has an input coupled to a megahertz (MHz) RF generator and is coupled to the output. The IMC includes a uniformity control circuit (UCC) defined from at least one of the plurality of tuning elements of the first circuit. The UCC is connected serially along the path of the first circuit to define a capacitance that at least partially influences a radial uniformity profile in an etch rate produced by a plasma chamber.

18 Claims, 27 Drawing Sheets

(56) References Cited

U.S. PATENT DOCUMENTS

| | | | | |
|---|---|---|---|---|
| 2003/0098127 A1* | 5/2003 | Nakano | ............ | H01J 37/32082 156/345.44 |
| 2005/0035770 A1* | 2/2005 | Hopkins | ............ | G01R 19/0061 324/655 |
| 2005/0241766 A1* | 11/2005 | Dhindsa | ............ | H01J 37/32009 156/345.34 |
| 2013/0260567 A1* | 10/2013 | Marakhtanov | .... | H01J 37/32165 438/710 |
| 2014/0054268 A1* | 2/2014 | Chen | ................ | H01J 37/32091 216/67 |
| 2015/0144808 A1* | 5/2015 | Ribton | .................... | H01J 27/18 250/493.1 |
| 2015/0380220 A1* | 12/2015 | Tan | .................... | H01J 37/32522 216/67 |
| 2016/0027667 A1* | 1/2016 | Sadjadi | ............... | C23C 16/4412 438/798 |
| 2016/0260584 A1* | 9/2016 | Marakhtanov | .... | H01J 37/32183 |

\* cited by examiner

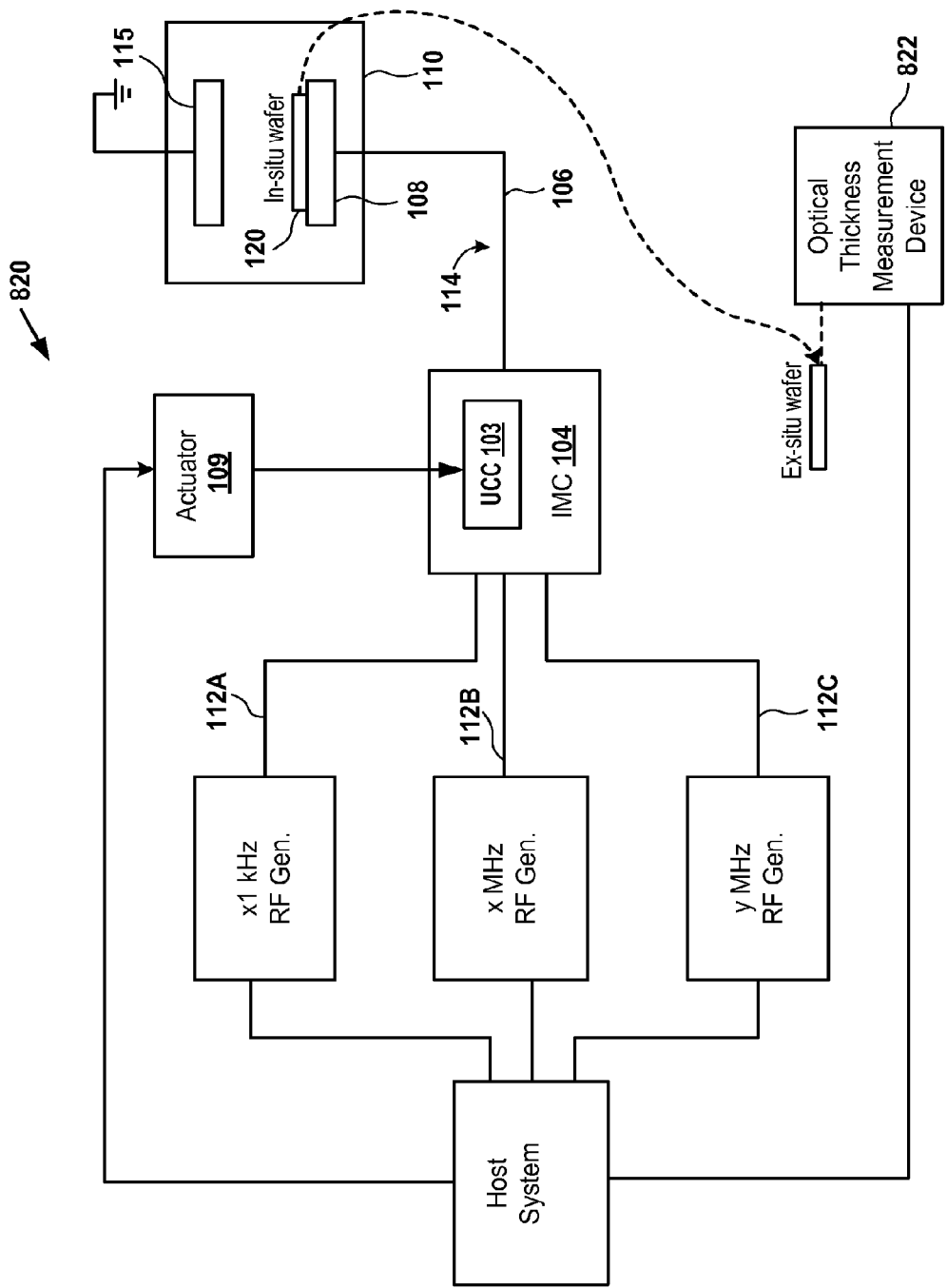
FIG. 8C (Etch Rate)

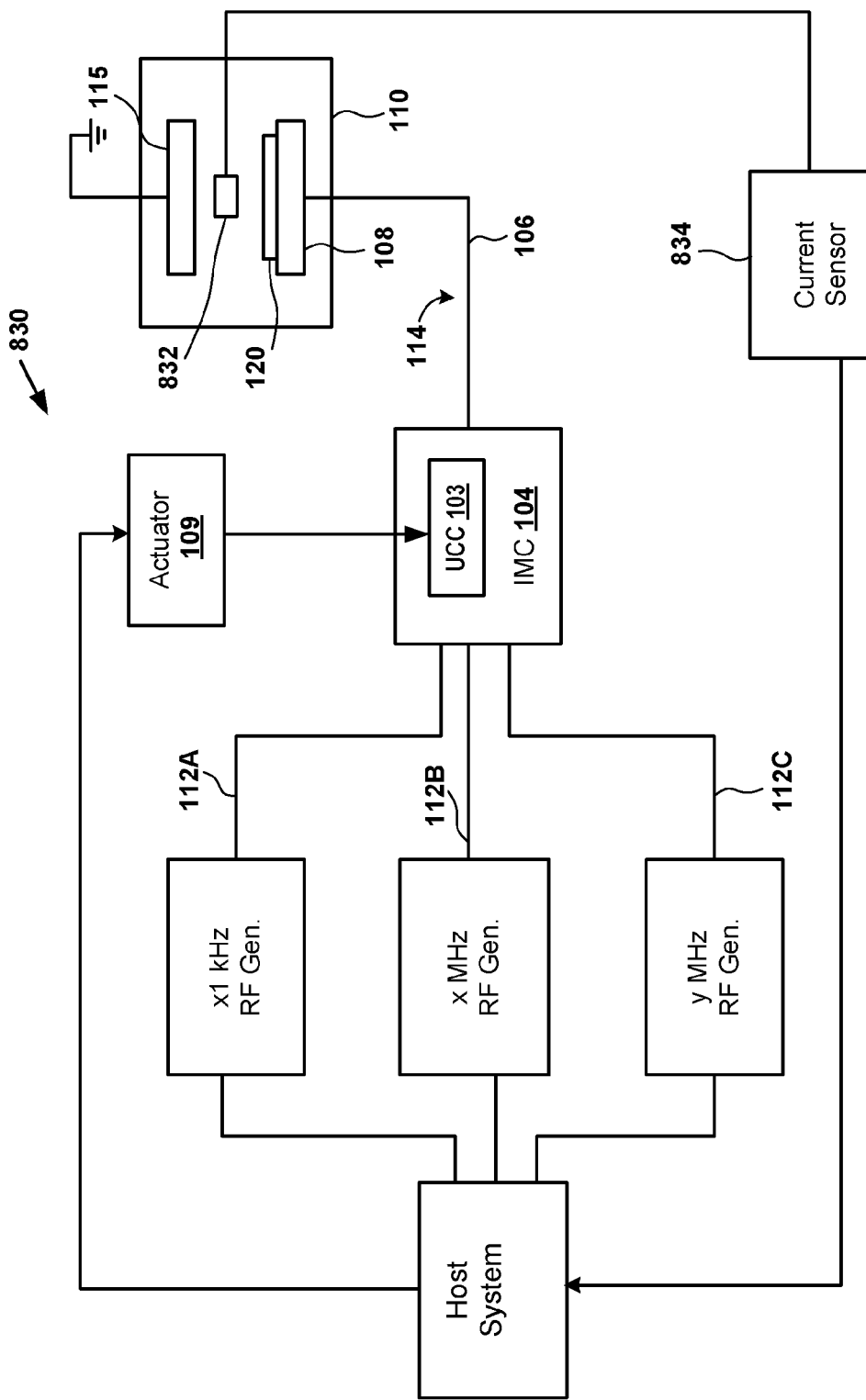
FIG. 8D (Current Density)

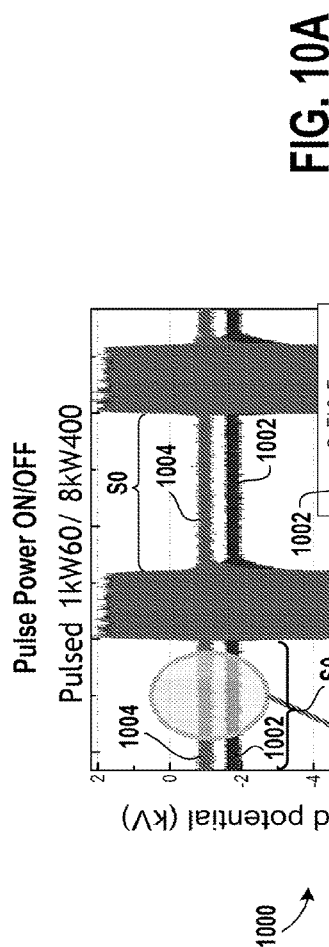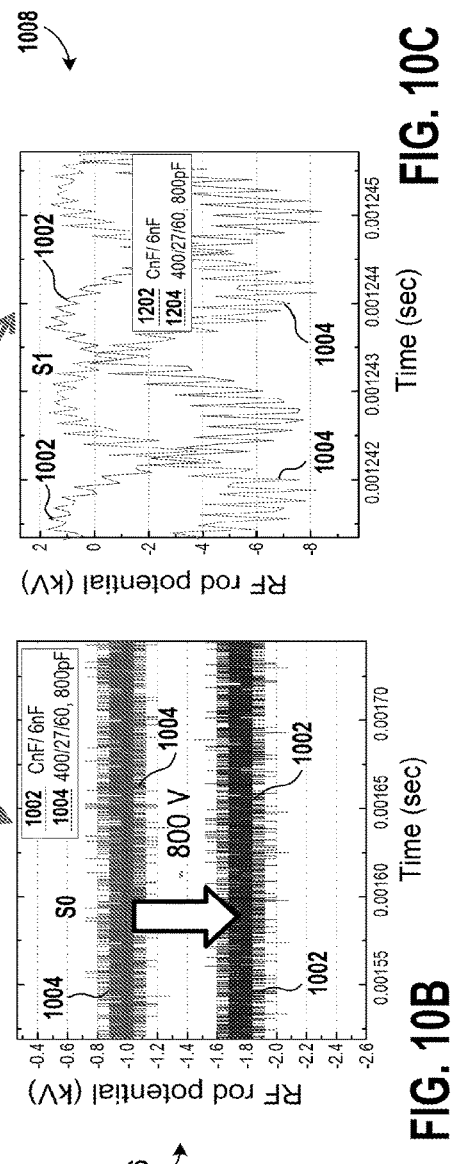
FIG. 10A
FIG. 10B
FIG. 10C

UNIFORMITY CONTROL CIRCUIT FOR USE WITHIN AN IMPEDANCE MATCHING CIRCUIT

CLAIM OF PRIORITY

This patent application is a divisional of and claims priority to and the benefit, under 35 U.S.C. §120, of co-pending patent application Ser. No. 14/878,666, filed on Oct. 8, 2015, titled "UNIFORMITY CONTROL CIRCUIT WITHIN AN IMPEDANCE MATCHING CIRCUIT", which is incorporated by reference herein in its entirety for all purposes.

FIELD

The present embodiments relate to a uniformity control circuit for use within an impedance matching circuit.

BACKGROUND

In fabricating a semiconductor wafer, plasma etching is commonly used to etch materials, e.g., oxides, etc., from a surface of the semiconductor wafer. To perform the etching, a plasma etch chamber is typically used. The plasma etch chamber is capable of etching selected layers deposited over the semiconductor wafer as defined by a photoresist mask. To perform the etching, the plasma etch chamber receives process gases, and radio frequency (RF) power is applied to one or more electrodes, e.g., an upper electrode, a lower electrode, etc., in the plasma etch chamber. Moreover, other variables, e.g., pressure within the plasma etch chamber, temperature within the plasma etch chamber, etc., are controlled in accordance with a particular desired process. Upon applying a desired amount of the RF power to the electrodes, the process gases in the plasma etch chamber are ionized such that plasma is created within a gap between the upper and lower electrodes.

In order to perform a desired amount of etching of the selected layers of the semiconductor wafer, impedance of plasma in the plasma etch chamber is controlled by manipulating one or more elements, such as, a gap between the upper and lower electrodes, shapes of the electrodes at edges of the electrodes, a flow of gas in region within the plasma etch chamber, etc. However, such manipulation of the elements is difficult to implement and costly.

It is in this context that embodiments described in the present disclosure arise.

SUMMARY

Embodiments of the disclosure provide apparatus, methods and computer programs for providing a uniformity control circuit for use within an impedance matching circuit. It should be appreciated that the present embodiments can be implemented in numerous ways, e.g., a process, an apparatus, a system, a device, or a method on a non-transitory computer-readable medium. Several embodiments are described below.

To change uniformity of plasma, e.g., to provide uniformity in etch rate, etc., a uniformity control circuit (UCC) is provided within an impedance matching circuit (IMC). The UCC is controlled either manually or via an actuator to change a characteristic of the UCC. The change in the characteristic of the UCC is made to simultaneously achieve one or more parameters, e.g., uniformity in etch rate, isolation from a megahertz signal that is being transferred in a circuit adjacent to the UCC, a desired amount of delivered power, etc.

The change in the characteristic is easy to implement and less costly than the manipulation of the elements described above. For example, it is easier and cost-effective to change the characteristic of the UCC compared to changing a shape of an electrode of a plasma chamber. As another example, it is much more difficult and costly to replace the electrode(s) from the plasma chamber compared to replacing the UCC from the IMC. As yet another example, it is easier to control the parameters by changing the characteristic of the UCC compared to controlling a flow of gases within the plasma chamber or controlling a gap between upper and lower electrodes of the plasma chamber. For example, movement of the upper and lower electrodes and the flow of gases are more difficult to control than controlling the characteristic of the UCC.

In an embodiment, an IMC is described. The IMC includes a first circuit that includes a first plurality of tuning elements defined along a path. The first circuit has an input coupled to a kilohertz (kHz) radio frequency (RF) generator. The first circuit is coupled to an output. The IMC further includes a second circuit having a second plurality of tuning elements. The second circuit has an input coupled to a megahertz (MHz) RF generator and is coupled to the output. The output of the first and second circuits is coupled to an input of an RF transmission line that is coupled to an electrode of a plasma chamber used for processing semiconductor substrates. The IMC includes a UCC defined from at least one of the plurality of tuning elements of the first circuit. The UCC is connected serially along the path of the first circuit to define a capacitance that at least partially influences a radial uniformity profile in an etch rate produced by the plasma chamber. A change in the capacitance causes an adjustment in the radial uniformity profile. and the kHz RF generator is configured to operate in a range of 50 kHz to less than 1000 kHz.

In one embodiment, a system is described. The system includes a kHz RF generator for generating and supplying a kHz RF signal. The kHz RF generator is configured to operate in a range of 50 kHz to less than 1000 kHz. The system further includes a MHz RF generator for generating and supplying a MHz RF signal. The system includes a first RF cable connected to an output of the kHz RF generator for receiving the kHz RF signal and a second RF cable connected to an output of the MHz RF generator for receiving the MHz RF signal. The system also includes an IMC coupled to the kHz RF generator via the first RF cable. The IMC is coupled to the MHz RF generator via the second RF cable. The IMC has an output and includes a first circuit including a first plurality of tuning elements located along a path for transferring the kHz RF signal. The IMC further includes a second circuit having a second plurality of tuning elements for transferring the MHz RF signal. The first and second circuits are coupled to the output. The IMC includes a UCC defined from at least one of the tuning elements of the first plurality. The system includes an RF transmission line coupled to the IMC and a plasma chamber including an electrode, which is connected to the RF transmission line. The UCC is located serially along the path of the first circuit to define a capacitance to adjust a radial uniformity profile of an etch rate produced by the plasma chamber.

In an embodiment, a method is described. The method includes controlling a characteristic of a UCC to achieve a radial uniformity in an etch rate. The UCC is a part of a first circuit, which includes a first plurality of tuning elements.

The first plurality of tuning elements includes remaining tuning elements. The first circuit has an input coupled to a kHz RF generator. The first circuit has an output that is coupled to a second circuit having a second plurality of tuning elements. The second circuit has an input coupled to a MHz RF generator. The output of the first and second circuits is coupled to an input of an RF transmission line. An output of the RF transmission line is coupled to an electrode of the plasma chamber. The method further includes adjusting characteristics of the remaining tuning elements of the first circuit after controlling the characteristic of the uniformity control circuit. The operation of adjusting the characteristics of the remaining tuning elements is performed to provide a pre-determined level of isolation from a MHz RF signal transferred through the second circuit and achieve a pre-determined level of power to be delivered to the electrode of the plasma chamber.

Some advantages of various embodiments of the systems and methods described herein include providing the UCC within the IMC for controlling one or more parameters. For example, a capacitance of a capacitor of the UCC is set to achieve radial plasma uniformity, e.g., a radial etch rate, etc. Also, the capacitance is set so that a pre-determined amount of power is delivered to an electrode within the plasma chamber and an amount of isolation from a high frequency RF signal, e.g., a megahertz (MHz) RF signal, etc., passing through a circuit of the IMC is achieved. In addition, in one embodiment, other parameters, e.g., RF rod potential, ion energy, etc., are achieved by setting the capacitance.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2B-2 is a circuit diagram of an embodiment of an IMC, which is another example of the IMC of FIG. 2A, to illustrate an embodiment of a UCC.

FIG. 8C is a diagram of an embodiment of a plasma system to illustrate use of a capacitance of a UCC to adjust or set a removal rate.

FIG. 8D is a block diagram of an embodiment of a plasma system to illustrate use of an ion saturation current density in controlling a capacitance of a UCC.

FIG. 10A is an embodiment of a graph to illustrate a change in RF rod potential with an increase in capacitance of a UCC, during a state S0 of an RF signal generated by the x1 kHz RF generator.

FIG. 10B is an embodiment of a zoom-in of the graph of FIG. 10A during the state S0 of the RF signal generated by the x1 kHz RF generator.

FIG. 10C is an embodiment of a zoom-in of the graph of FIG. 10A during a state S1 of the RF signal generated by the x1 kHz RF generator.

DETAILED DESCRIPTION

The following embodiments describe systems and methods for using a uniformity control circuit within an impedance matching circuit. It will be apparent that the present embodiments may be practiced without some or all of these specific details. In other instances, well known process operations have not been described in detail in order not to unnecessarily obscure the present embodiments.

A uniformity control circuit (UCC) is provided for simultaneously achieving one or more parameters. For example, a characteristic of the UCC is changed, either manually or via an actuator, to achieve radial uniformity in plasma, e.g., radial uniformity in etch rate, etc. Moreover, the characteristic is changed to simultaneously achieve a desired amount of isolation from a high frequency signal, e.g., a megahertz signal, etc., that is being transferred adjacent to the UCC. Also, the characteristic is changed to simultaneously achieve a desired amount of power delivered from a kilohertz RF generator. The UCC is located within a circuit of an impedance matching circuit (IMC) and kilohertz RF generator is connected to the circuit of the IMC to provide a kHz RF signal to the circuit.

Also, in one embodiment, other parameters, such as, a desired amount of ion energy, a desired amount of RF rod potential, a desired amount of ion saturation current, etc., are achieved by changing the characteristic of the UCC.

Figure 1A:
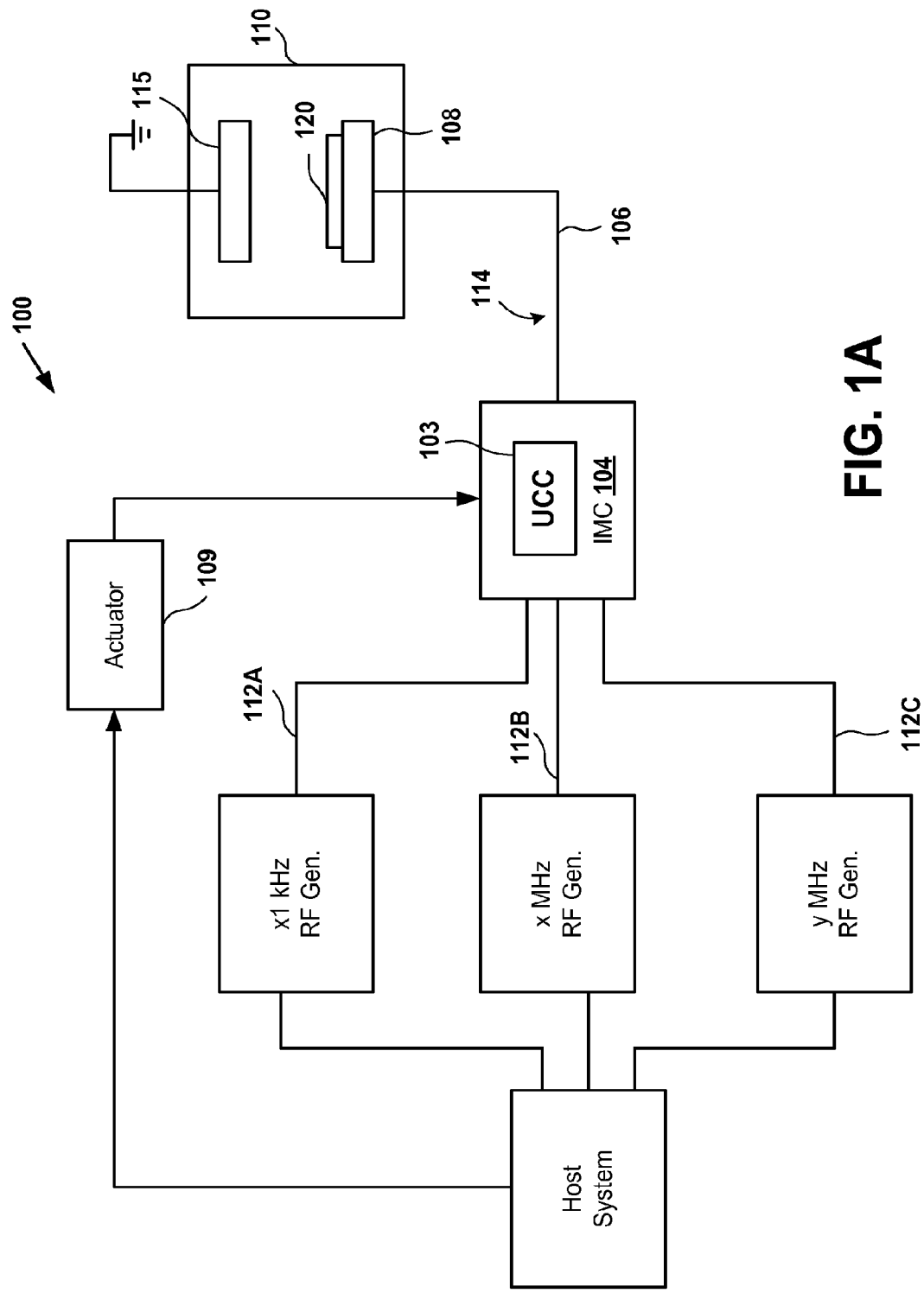
FIG. 1A is a diagram of an embodiment of a plasma system for illustrating a control of a uniformity control circuit (UCC) within an impedance matching circuit (IMC).

FIG. 1A is a diagram of an embodiment of a plasma system 100 for illustrating a control of a UCC 103 within an impedance matching circuit (IMC) 104. The system 100 includes an x1 kilohertz (kHz) radio frequency (RF) generator, an x megahertz (MHz) RF generator, and a y MHz RF generator. As an example, the x1 kHz generator generates RF signals having a frequency ranging between 50 kHz and 1 MHz, e.g., from and including 50 kHz to 1 MHz, etc. As another example, the x1 kHz generator generates an RF signal having a frequency ranging between 360 kHz and 440 kHz. As yet another example, the x1 kHz generator generates an RF signal having a frequency ranging between 340 kHz and 440 kHz. As still another example, the x1 kHz generator generates RF signals having a frequency ranging between 50 kHz and 999 kHz. As another example, the y MHz RF generator generates RF signals having a frequency ranging between 57 MHz and 63 MHz.

The x MHz RF generator generates RF signals having a higher frequency than that of the x1 kHz RF generator, and y MHz RF generator generates RF signals having a higher frequency than that of the x MHz RF generator. For example, the x MHz RF generator generates RF signals having a frequency ranging between −10% from 27 MHz and 10% from 27 MHz, and the y MHz RF generator generates RF signals having a frequency ranging between −10% from 60 MHz and 10% from 60 MHz. As yet another example, the x MHz RF generator generates RF signals having a frequency ranging between −10% from 2 MHz and 10% from 2 MHz, and the y MHz RF generator generates RF signals having a frequency ranging between −10% from 27 MHz and 10% from 27 MHz. As another example, the x MHz RF generator generates RF signals having a frequency ranging between −10% from 2 MHz and 10% from 2 MHz, and the y MHz RF generator generates RF signals having a frequency ranging between −10% from 60 MHz and 10% from 60 MHz.

It should be noted that various RF power levels are generated by the x1 kHz RF generator and the y MHz RF generator. For example, when the x1 kHz RF generator generates an RF signal having a power of 15 kilowatts (kW), the y MHz RF generator generates an RF signal having a power of 6 kW. As another example, when the x1 kHz RF generator generates an RF signal having a power of 21 kW, the y MHz RF generator generates an RF signal having a power of 6 kW. As yet another example, when the x1 kHz RF generator generates an RF signal having a power of 21 kW, the y MHz RF generator generates an RF signal having a power of 8 kW.

An input of the IMC 104 is connected to an output of the x1 kHz RF generator via an RF cable 112A, another input of the IMC 104 is connected to an output of the x MHz RF generator via another RF cable 112B, and yet another input of the IMC 104 is connected to an output of the y MHz RF generator via yet another RF cable 112C. Moreover, an output of the IMC 104 is coupled to an RF transmission line 106. For example, the output of the IMC 104 is connected to the RF transmission line 106 via an RF strap. The RF transmission line 106 includes an RF rod that is surrounded by an insulator.

The RF transmission line 106 is connected to a chuck 108 of a plasma chamber 110. As an example, the chuck 108 includes a lower electrode and a ceramic layer placed with respect to, e.g., on top of, etc., the lower electrode. As another example, the chuck 108 includes the lower electrode, the ceramic layer, and a facility plate placed with respect to, e.g., below, etc., the lower electrode. The lower electrode of the chuck 108 is made of a metal, e.g., anodized aluminum, alloy of aluminum, etc.

The plasma chamber 110 further includes an upper electrode 115. The upper electrode 115 is made of an electrically conductive material, e.g., aluminum, alloy of aluminum, low resistivity silicon, etc. The upper electrode 115 is located opposite to and facing the lower electrode of the chuck 108. The upper electrode 115 is grounded, e.g., coupled to a reference voltage, coupled to zero voltage, coupled to a negative voltage, etc. A substrate 120 is placed on a top surface 122 of the chuck 108 for processing, e.g., depositing materials on the substrate 120, or cleaning the substrate 120, or etching deposition layers from the substrate 120, or doping the substrate 120, or sputtering the substrate 120, or a combination thereof.

A host system, e.g., a computer, a controller, a processor, a processor coupled to a memory device, etc., is connected to inputs of the x1 kHz RF generator, the x MHz RF generator, and the y MHz RF generator to provide a recipe control signal, e.g., a signal including a power level, a signal including a frequency level, etc., to each of the x1 kHz, the x MHz, and the y MHz RF generators. Other examples of the host system include a central processing unit (CPU), an application specific integrated circuit (ASIC), a programmable logic device (PLD), a field programmable gate array (FPGA), etc. Examples of a memory device include a read-only memory (ROM), a random access memory (RAM), a hard disk, a volatile memory, a non-volatile memory, a redundant array of storage disks, a Flash memory, etc.

The host system is coupled to an actuator 109 via a cable. The actuator 109 includes mechanical components, e.g., a motor, one or more shafts in a series connected to the motor, a gear mechanism connected to the shafts, and one or more shafts in series connected to the gear mechanism. The one or more shafts connected to the gear mechanism are also connected at an opposite end to a plate of the UCC 103, etc. A rotor of the motor rotates to rotate the one or more shafts connected to the motor, to further rotate the gear mechanism, which further rotates the one or more shafts connected to the gear mechanism to rotate the plate of the UCC 103. In some embodiments, a plate of a capacitor is referred to herein as a variable control. The rotation of the plate changes an overlapping area between plates of the UCC 103 to change a capacitance of the UCC 103. Another example of the mechanical components of the actuator 109 includes a motor, and one or more shafts in series connected to the motor. The one or more shafts are also connected to a plate of the UCC 103. A rotor of the motor rotates to rotate the one or more shafts connected to the motor to rotate the plate of the UCC 103. The rotation of the plate further changes an overlapping area between plates of the UCC 103 to change a capacitance of the UCC 103.

Upon receiving the recipe control signal, each RF generator generates an RF signal having the frequency and power levels. For example, the x1 kHz RF generator includes a digital signal processor (DSP), which upon receiving the recipe control signal controls a driver, e.g., one or more transistors, etc., to drive an RF power supply, e.g., an RF oscillator, an RF power source, etc., which generates an RF signal at an output of the x1 kHz RF generator, and the RF signal has a power level and a frequency level, both of which are included in the recipe control signal. The x1 kHz RF generator generates an RF signal having a frequency of x1 kHz, the x kHz RF generator generates an RF signal having a frequency of x MHz, and the y MHz RF generator generates an RF signal having a frequency of y MHz.

The IMC 104 receives the RF signals via the RF cables 112A, 112B, and 112C from the x1 kHz, x MHz, and y MHz RF generators, and matches an impedance of a load connected to an output of the IMC 104 with that of a source connected to one or more inputs of the IMC 204 to generate a modified RF signal 114. Examples of the source include the x1 kHz, x MHz, and y MHz RF generators and the RF cables 112A, 112B, and 112C that couple the RF generators to the IMC 104. Examples of the load include the RF transmission line 106 and the plasma chamber 110. The modified RF signal 114 is provided by the IMC 104 via the RF transmission line 106 to the chuck 108.

At a time the modified RF signal 114 is supplied from the IMC 104 to the chuck 108, a process gas, e.g., an oxygen-containing gas, a fluorine-containing gas, a gas containing carbon and fluorine, etc. is supplied between the upper electrode 115 and the chuck 108 via gas inlets in the upper electrode 115. An example of the oxygen-containing gas includes oxygen and examples of the fluorine-containing gas include tetrafluoromethane ($CF_4$), sulfur hexafluoride ($SF_6$), hexafluoroethane ($C_2F_6$), $C_4F_6$ gas, $C_4F_3$ gas, $C_3F_8$ gas, etc. When both the process gas and the modified RF signal 114 are supplied to the plasma chamber 110, plasma is generated or is maintained within the plasma chamber 110 to process the substrate 120.

During processing of the substrate 120, the host system sends a command signal to the actuator 109 to rotate the actuator 109. The rotation of the actuator 109 changes a capacitance of the UCC 103. As an example, a capacitance of the UCC 103 is changed to set the capacitance between 600 picoFarads to 15000 picoFarads. As another example, a capacitance of the UCC 103 is changed to set the capacitance between 800 picoFarads to 12000 picoFarads. As yet another example, a capacitance of the UCC 103 is changed to set the capacitance between 1000 picoFarads to 10000 picoFarads. The change in capacitance of the UCC 103 is used to control or set one or more parameters, e.g., isolation between two adjacently located circuits of the IMC 104, power delivered by the x1 kHz RF generator, RF rod potential of the RF transmission line 106, wafer direct current (DC) bias at the substrate 120, ion energy of plasma, ion saturation current density, etch rate of etching the substrate 120, etc. The one or more parameters are described in a U.S. patent application Ser. No. 14/636,007, filed on Mar. 2, 2015, titled "Impedance Matching Circuit for Operation with a Kilohertz RF Generator and a Megahertz RF Generator to Control Plasma Processes", which is incorporated by reference herein in its entirety.

In one embodiment, the plasma system 100 includes any other number of RF generators. For example, the plasma system 100 includes the x1 kHz and the x MHz RF generator without including the y MHz RF generator. As another example, the plasma system 100 includes the x1 kHz and the y MHz RF generator without including the x MHz RF generator.

In an embodiment, instead of connecting the RF transmission line 106 to the chuck 108, the RF transmission line 106 is connected to the upper electrode 115 and the lower electrode of the chuck 108 is grounded.

In one embodiment, the source changes with a change in a number of generators that are connected to the IMC 104. For example, when the x1 kHz and x MHz RF generators are connected to the IMC 104 via RF cables 112A and 112B, the source is the x1 kHz RF generator, the x MHz RF generator, the RF cable 112A that connects the x1 kHz RF generator to the IMC 104, and the RF cable 112B that connects the x MHz RF generator to the IMC 104. As another example, when the x1 kHz and y MHz RF generators are connected to the IMC 104 via RF cables 112A and 112C, the source is the x1 kHz RF generator, the y MHz RF generator, the RF cable 112A that connects the x1 kHz RF generator to the IMC 104, and the RF cable 112C that connects the y MHz RF generator to the IMC 104.

Figure 1B:
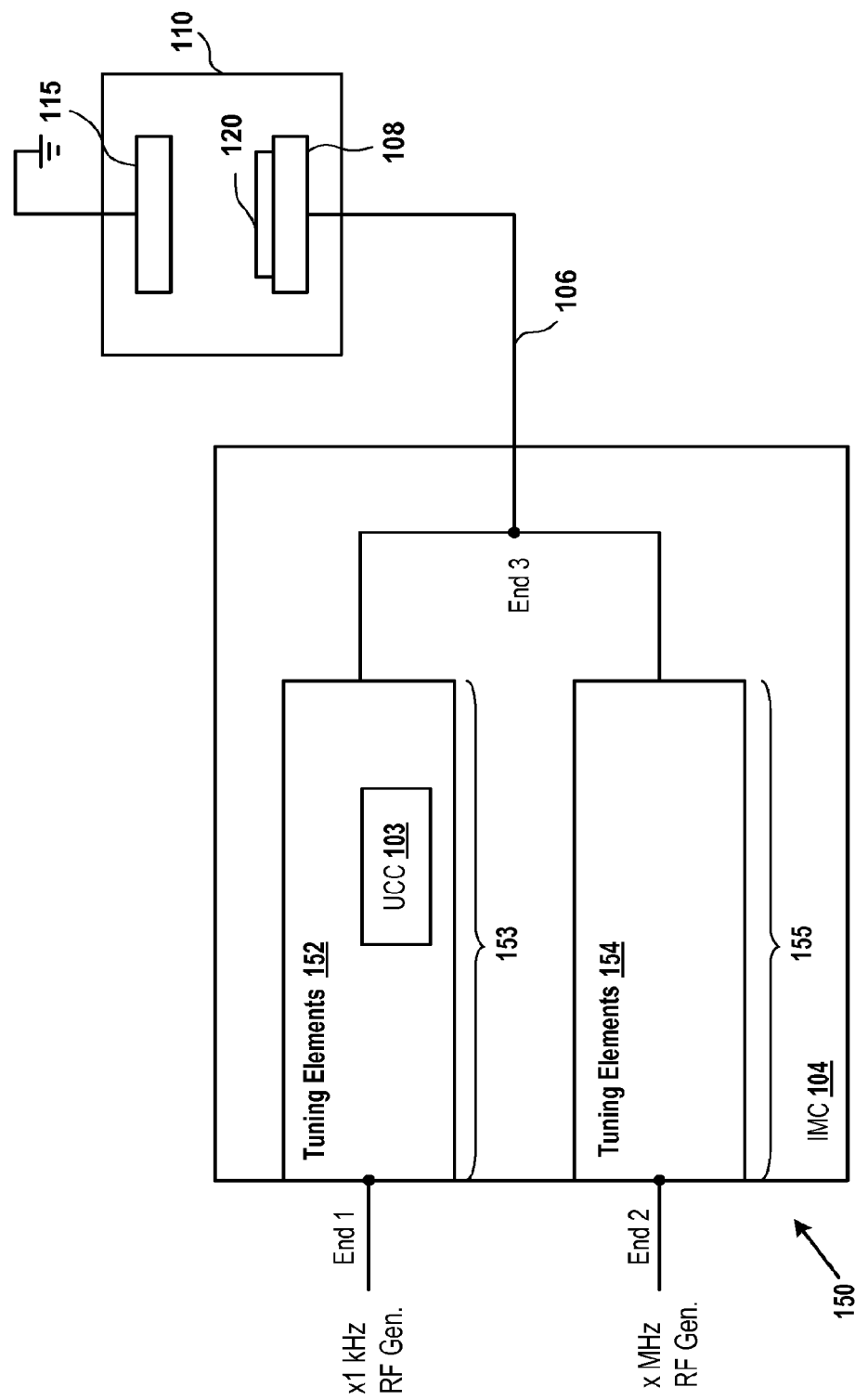
FIG. 1B is a diagram of an embodiment of a plasma processing system to illustrate a location of the UCC within the IMC of FIG. 1A.

FIG. 1B is a diagram of an embodiment of a plasma processing system 150 to illustrate a location of the UCC 103 within the IMC 104. The IMC 104 includes a plurality of tuning elements 152 of a circuit and includes another plurality of tuning elements 154 of a circuit. The UCC 103 is connected serially to one or more of the tuning elements 152 along a path 153. The tuning elements 152 are connected along the path 153 and the UCC 103 is one of the tuning elements 152. The path 153 is located between ends 1 and 3. For example, the path 153 is connected to the end 1 and is also connected to the end 3, which is an output of the IMC 104. The end 1 is connected to the x1 kHz RF generator, and the end 3 is connected to the RF transmission line 106. Moreover, the IMC 104 includes a plurality of tuning elements 154. The tuning elements 154 are connected along a path 155. The path 155 is connected to an end 2 and is connected to the end 3. The end 2 is connected to the x MHz RF generator.

Figure 2A:
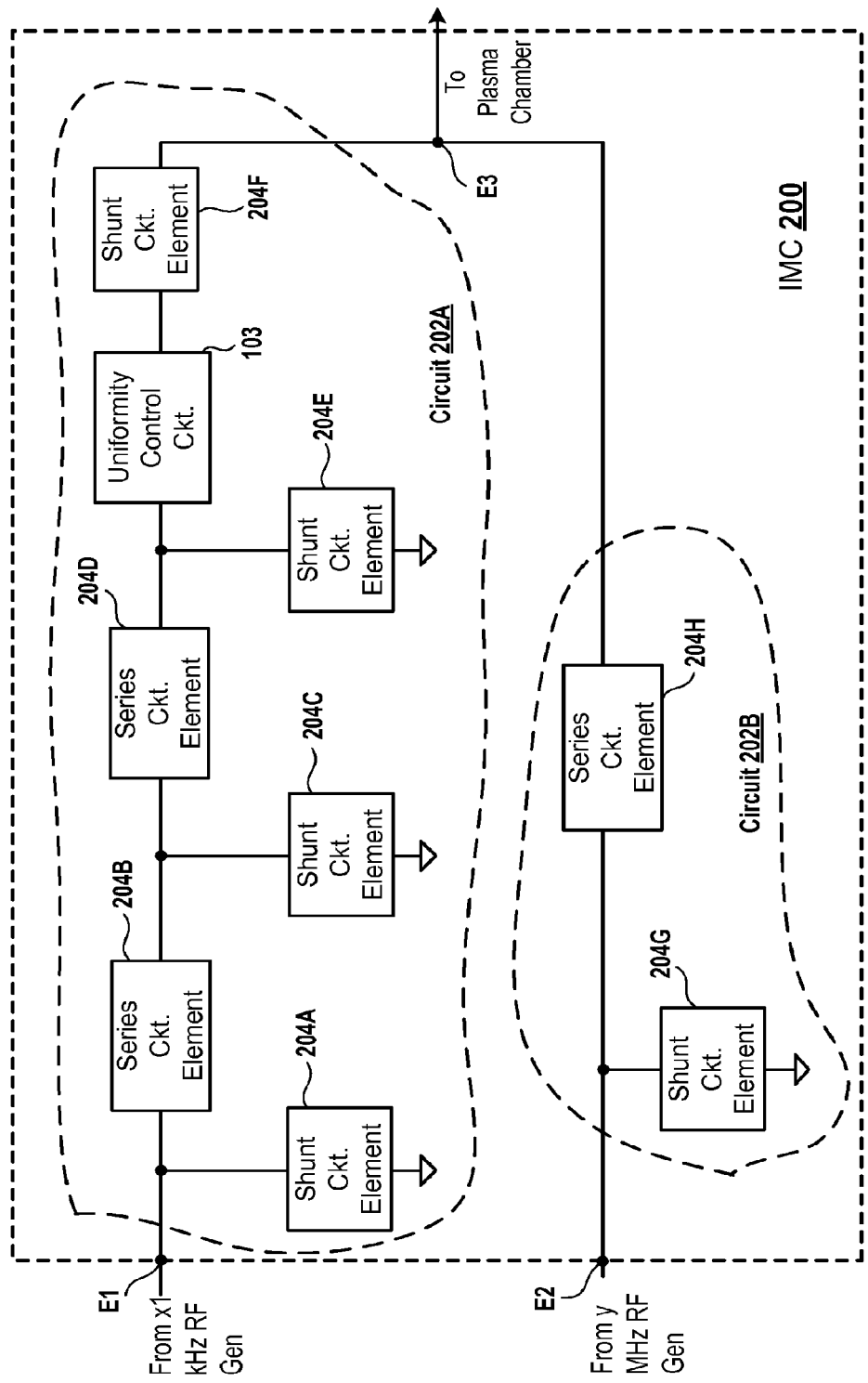
FIG. 2A is a diagram of an embodiment of an IMC, which is an example of the IMC of FIG. 1A.

In one embodiment, instead of the x MHz RF generator, a y MHz RF generator is used in the plasma processing system 150 of FIG. 1B. FIG. 2A is a diagram of an embodiment of an IMC 200, which is an example of the IMC 104 (FIG. 1A). The IMC 200 includes a circuit 202A and a circuit 202B. The circuit 202B is located adjacent to the circuit 202A. The circuit 202A includes a shunt circuit element 204A, a series circuit element 204B, a shunt circuit element 204C, a series circuit element 204D, a shunt circuit element 204E, the UCC 103, and a series circuit element 204F.

The UCC 103 is located between the series circuit element 204F and the shunt circuit element 204E. For example, a node of the UCC 103 is connected to the shunt circuit element 204E and another node of the UCC 103 is connected to the series circuit element 204F. Also, the UCC 103 is located between the series circuit elements 204D and 204F. For example, the node of the UCC 103 that is connected to the shunt circuit element 204E is also connected to the series circuit element 204D and another node of the UCC 103 is connected to the series circuit element 204F. As another example, the UCC 103 is serially connected to the series circuit element 204F, the series circuit element 204D, and the series circuit element 204B. The UCC 103 is not a shunt circuit element, which is grounded.

Moreover, the circuit 202B includes a shunt circuit element 204G and a series circuit element 204H. Examples of a series circuit element include one or more inductors, or one or more capacitors, or a combination thereof. Examples of a shunt circuit element include one or more inductors, or one or more capacitors, or a combination thereof. Each shunt circuit element is grounded. Each series circuit element or a shunt circuit element or the UCC 103 is sometimes referred to herein as a tuning element.

The circuit 202A is connected at its input, e.g., an input of the series circuit element 204B, an end E1, etc., to an output of the x1 kHz RF generator (FIG. 1A) via the RF cable 212A. Moreover, the circuit 202B is connected at its input, e.g., an end E2, an input of the series circuit element 204H and of the shunt circuit element 204G, etc., to an output of the y MHz RF generator via the RF cable 212C.

A tuning element of a circuit, e.g., the circuit 202A, the circuit 202B, etc., acts as a blocking component that reduces an effect, e.g., blocks cross-talk, blocks an electric field, blocks a magnetic field, etc., that is created by a transfer of an RF signal in an adjacent circuit. For example, the series circuit elements 204B and 204D, the uniformity control circuit 103, the series circuit element 204F, and the shunt circuit elements 204A, 204C, and 204E reduce an effect of a MHz RF signal that is transferred via the circuit 202B. An example of an RF signal that is transferred via a circuit, e.g., circuit 202A, circuit 202B, etc., includes a supplied signal that is generated by and received from an RF generator that is coupled to the circuit. Another example of an RF signal that is transferred via a circuit, e.g., the circuit 202A, the circuit 202B, etc., includes a reflected signal that is reflected from the plasma chamber 110 (FIG. 1A), via the RF transmission line 106 (FIG. 1A) and the circuit towards an RF generator that is coupled to the circuit.

In one embodiment, a shunt circuit element creates a low resistance path to allow passage of an electric current to a ground connection. For example, the shunt circuit element 204C creates a low resistance path to ground for an electric current of an RF signal that passes through the circuit 202A. The circuits 202A and 202B are connected at an end E3 to the RF transmission line 106.

The circuit 202A receives an RF signal that is generated and supplied by the x1 kHz RF generator, and the circuit 202B receives an RF signal that is generated and supplied by the y MHz RF generator. The circuit 202A isolates an effect of the RF signal that is sent via the circuit 202B to the end 220. The RF signal received from the x1 kHz RF generator is sent via the series circuit elements 204B and 204D, the UCC 103, and the series circuit element 204F to the end 220. Moreover, the RF signal received from the y MHz RF generator is sent via the series circuit element 204H to the end 220. After isolating effects of the supplied RF signals from each other as described above, the RF signals received at the end 220 via the circuits 202A and 202B are combined, e.g., added, etc., at the end 220 and the IMC 200 matches an impedance of the load with the source to generate the modified RF signal 114 (FIG. 1A).

Also, during a time plasma is generated or maintained within the plasma chamber 110 (FIG. 1A), power from the plasma is reflected back in a form of a reflected RF signal towards the x1 kHz and y MHz RF generators via the RF transmission line 106. The reflected RF signal is divided at the end 220 between the circuits 202A and 202B. Power of a portion of the reflected RF signal that is received from the end 220 and reflected back towards the x1 kHz RF generator via the circuit 202A is isolated from power of a portion of the reflected RF signal that is received from the end 220 and reflected back towards the y MHz RF generator via the circuit 202B.

In addition to blocking an effect of an RF signal that is transferred via the circuit 202B, a tuning element of the circuit 202A also facilitates achievement of a pre-determined amount of delivered power. For example, the tuning elements of the first circuit 202A filter out power of the portion of the reflected RF signal that is received from the end 220 and reflected back towards the x1 kHz RF generator to achieve the pre-determined amount power delivered to the chuck 108 (FIG. 1A) of the plasma chamber 110. Power delivered by an RF generator is a difference between power that is generated and supplied by the RF generator and power that is reflected towards the RF generator.

Moreover, in addition to providing a pre-determined amount of isolation from the MHz RF signal transferred via the second circuit 202B and achieving the pre-determined amount of power delivered to the chuck 108, the UCC 103 helps to achieve one or more pre-determined values of the one or more parameters. For example, a capacitance of the UCC 103 is changed so that uniformity in an etch rate is achieved. As another example, a capacitance of the UCC 103 is changed so that a desired RF rod potential is achieved.

In one embodiment, initially, a capacitance of the UCC 103 is adjusted or set so that one or more pre-determined values of the one or more parameters are achieved. Once one or more pre-determined values of the one or more parameters are achieved, characteristics, e.g., capacitances, inductances, etc., of the remaining tuning elements of the circuit 202A, e.g., the shunt circuit element 204A, the series circuit element 204B, the shunt circuit element 204C, the series circuit element 204D, the shunt circuit element 204E, and the series circuit element 204F, etc., are adjusted or set to provide the pre-determined amount of isolation from the MHz RF signal transferred via the second circuit 202B and to achieve the pre-determined amount of power delivered by the x1 kHz RF generator to the chuck 108. For example, a capacitance of a capacitor, which is one of the remaining tuning elements, is changed manually or by the host system via an actuator, similar to the actuator 109, to achieve the pre-determined amount of isolation and to achieve the pre-determined amount of power delivered from the x1 kHz RF generator to the chuck 108. The capacitance of the capacitor is changed manually by a user when the user replaces the capacitor with another capacitor or when the user adds another capacitor in series or parallel to the capacitor. As another example, an inductance of an inductor, which is one of the remaining tuning elements, is changed manually or by the host system via an actuator, similar to the actuator 109, to achieve the pre-determined amount of isolation and to achieve the pre-determined amount of power delivered from the x1 kHz RF generator to the chuck 108. The inductance of the inductor is changed manually by the user when the user replaces the inductor with another inductor or when the user adds another inductor in series or parallel to the inductor. The characteristics of the remaining tuning elements are changed to provide the pre-determined amount of isolation from the MHz RF signal transferred via the second circuit 202B and to achieve the pre-determined amount of power delivered from the x1 kHz RF generator to the chuck 108 in a manner similar to that described below in which a characteristic of the UCC 103 is changed to provide the pre-determined amount of isolation from the MHz RF signal transferred via the second circuit 202B and to achieve the pre-determined amount of power delivered from the x1 kHz RF generator to the chuck 108.

In one embodiment, initially, a capacitance of the UCC 103 is adjusted or set so that one or more pre-determined values of the one or more parameters are achieved. Once one or more pre-determined values of the one or more parameters are achieved, characteristics, e.g., capacitances, inductances, etc., of the tuning elements of the circuit 202A, e.g., the shunt circuit element 204A, the series circuit element 204B, the shunt circuit element 204C, the UCC 103, the series circuit element 204D, the shunt circuit element 204E, and the series circuit element 204F, etc., are adjusted or set to provide the pre-determined amount of isolation from the MHz RF signal transferred via the second circuit 202B and to achieve the pre-determined amount of power delivered by the x1 kHz RF generator to the chuck 108.

In one embodiment, the characteristics of the remaining tuning elements of the circuit 202A are changed so that an amount of isolation within a pre-determined threshold from the pre-determined amount of isolation from the MHz RF signal transferred via the second circuit 202B is achieved. Moreover, the characteristics of the remaining tuning elements of the circuit 202A are changed so that an amount of delivered power within a pre-determined threshold from the pre-determined amount of power delivered from the x1 kHz RF generator to the chuck 108 is achieved.

In an embodiment, a transfer, as used herein, is in a send direction from an RF generator to an RF transmission line or in a reflected direction from a plasma chamber and the RF transmission line to the RF generator.

In one embodiment, instead of being connected to the y MHz RF generator, the circuit 202B is connected to the x MHz RF generator.

In one embodiment, a shunt circuit element cannot be used to control uniformity in an etch rate. For example, a change in a characteristic of a shunt circuit element has no effect or minimal effect in the uniformity in an etch rate.

In one embodiment, the UCC 103 is not a part of a path, e.g., the path 155 (FIG. 1B), etc., that is connected to the x MHz RF generator. For example, the UCC 103 is not a part of the circuit 202B. The UCC 103 when used with the x MHz RF generator cannot store charge for a long period of time, which the UCC 103 can when the UCC 103 is a part of the path 153 (FIG. 1B) connected to the x1 kHz RF generator. As such, the UCC 103 when integrated within the path 153 connected to the x1 kHz RF generator is used to control the one or more parameters. Moreover, the UCC 103 cannot be used to control an etch rate uniformity profile when the UCC 103 is a part of the path that is connected to the x MHz RF generator. Similarly, the UCC 103 is not a part of a path that is connected to the y MHz RF generator.

Figures 1, 2B:
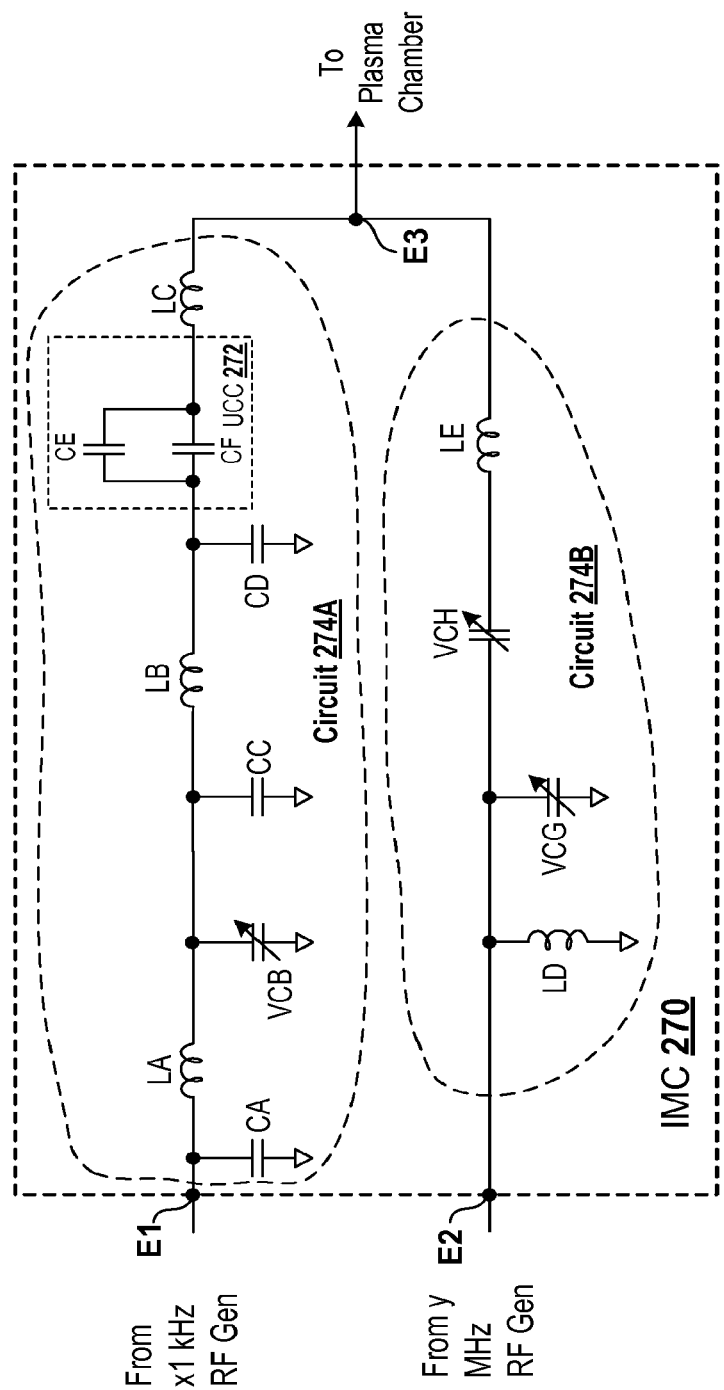
FIG. 2B-1 is a circuit diagram of an embodiment of an IMC, which is an example of the IMC of FIG. 2A, to illustrate an embodiment of a UCC.

FIG. 2B-1 is a circuit diagram of an embodiment of an IMC 270, which is an example of the IMC 200 (FIG. 2A), to illustrate an embodiment of a UCC 272. The UCC 272 is an example of the UCC 103 (FIG. 2A). The IMC 270 includes inductors and capacitors. For example, a circuit 274A of the IMC 270 that is connected to the x1 kHz RF generator includes a capacitor CA, an inductor LA, a variable capacitor VCB, a capacitor CC, an inductor LB, a capacitor CD, a capacitor CE, a capacitor CF, and an inductor LC. As another example, a circuit 274B of the IMC 270 that is connected to the y MHz RF generator includes an inductor LD, a variable capacitor VCG, a variable capacitor VGH, and an inductor LE.

The capacitors CE and CF have fixed capacitances. For example, the capacitor CE has a capacitance of 3000 pF and the capacitor CF has a capacitance of 3000 pF. As another example, the capacitor CE has a capacitance of A pF and the capacitor CF has a capacitance of B pF, where A and B are integers greater than zero. The capacitors CE and CF are parts of the UCC 272. In an embodiment, the capacitances of the capacitors CE and CF are set, e.g., selected, etc., based on thickness of the chuck 108.

The capacitor CA is an example of the shunt circuit element 204A (FIG. 2A), the inductor LA is an example of the series circuit element 204B (FIG. 2A), a parallel circuit formed by the capacitors VCB and CC is an example of the shunt circuit element 204C, the inductor LB is an example of the series circuit element 204D (FIG. 2A), the capacitor CD is an example of the shunt circuit element 204E, and the inductor LC is an example of the series circuit element 204F (FIG. 2A). A parallel circuit formed by the inductor LD and the capacitor VCG is an example of the shunt circuit element 204G (FIG. 2A), and a series circuit element formed by the capacitor VCH and the inductor LE is an example of the series circuit element 202B (FIG. 2A).

A capacitance of one of the capacitors CE and CD or both the capacitors CE and CF is changed to achieve, e.g., set, etc., a combined capacitance. The combined capacitance is set to achieve the pre-determined amount of isolation of an RF signal transferred via the circuit 274A from an RF signal transferred via the circuit 274B simultaneous with achieving the pre-determined amount of power delivered from the x1 kHz RF generator and with achieving one or more pre-determined values of the one or more parameters.

In one embodiment, instead of using a component, e.g., a capacitor, an inductor, etc., of an IMC, multiple components are connected to each other to achieve a characteristic, e.g., capacitance, inductance, etc., of the component. For example, instead of the capacitor CF, multiple capacitors are coupled in parallel or series with each other to achieve a capacitance of the capacitor CF. As another example, instead of the capacitor CE, multiple capacitors are coupled in parallel or series to achieve a capacitance of the capacitor CE.

In an embodiment, instead of using multiple components, e.g., multiple capacitors, multiple inductors, etc., of an IMC, one component is used to achieve a characteristic, e.g., capacitance, inductance, etc., of the multiple components. For example, instead of the capacitors CE and CF, one capacitor is used to achieve a combined capacitance of the capacitors CE and CF.

In an embodiment, a capacitor that is not a variable capacitor, as referred to herein, is a fixed capacitor and a fixed capacitance of the fixed capacitor is changed manually, e.g., when the user replaces the fixed capacitor with another fixed capacitor having a fixed capacitance, etc.

In an embodiment, instead of using the fixed capacitor CE, a variable capacitor is used. In one embodiment, instead of using the fixed capacitor CF, a variable capacitor is used.

In one embodiment, instead of any of the capacitors CA, CC, and CD, a variable capacitor is used. Moreover, in an embodiment, instead of any of the variable capacitors VCB, VCG, and VCH, a fixed capacitor is used. In one embodiment, instead of any of the fixed inductors LA, LB, LC, LD, and LE, a variable inductor is used.

Figures 2, 2B:
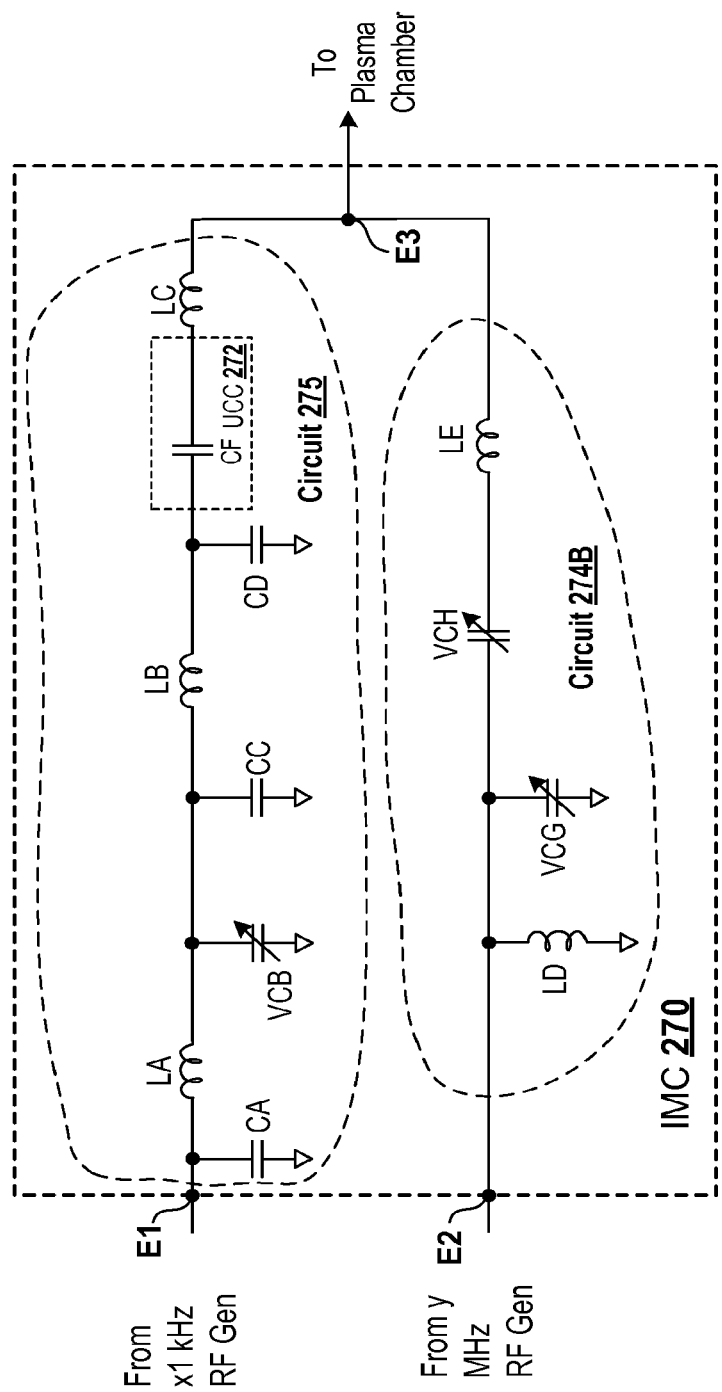

FIG. 2B-2 is a circuit diagram of an embodiment of an IMC 271 to illustrate a UCC 273. The IMC 271 is an example of the IMC 200 (FIG. 2A). The IMC includes a circuit 275 that further includes the UCC 273. The circuit 275 is similar to the circuit 274A (FIG. 2B-1) except that the circuit 275 includes the UCC 273. The UCC 273 is a capacitor CCF, which has a fixed capacitance. The capacitor CCF is serially located between the inductors LB and LC. For example, a node of the inductor LB is connected to a node of the capacitor CCF and a node of the inductor LC is connected to another node of the capacitor CCF. Moreover, the capacitor CCF is located between the shunt capacitor CD and the inductor LC. For example, a node of the capacitor CCF is connected to a node of the capacitor CD and a node of the inductor CCF is connected to another node of the inductor LC.

In one embodiment, instead of the fixed capacitor CCF, a variable capacitor is used. In one embodiment, instead of the fixed capacitor CCF, multiple capacitors connected in series are used. In an embodiment, instead of the fixed capacitor CCF, multiple variable capacitors connected in series are used. In one embodiment, instead of the fixed capacitor CCF, multiple variable capacitors connected in parallel are used.

Figure 3A:
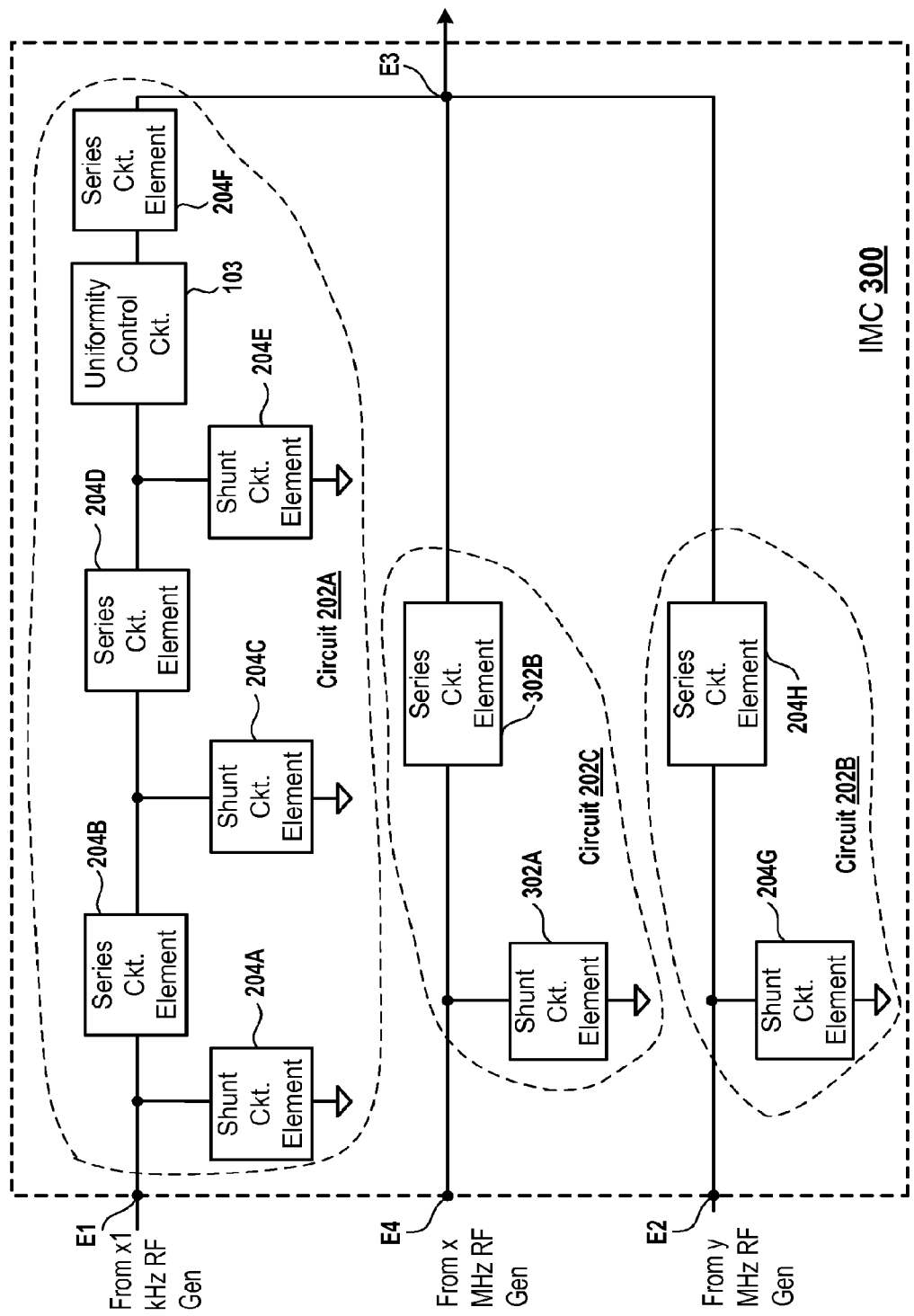
FIG. 3A is a diagram of an embodiment of an IMC that is used with radio frequency (RF) generators of the system of FIG. 1A.

FIG. 3A is a diagram of an embodiment of an IMC 300 that is used with the x1 kHz, x MHz, and y MHz RF generators. The IMC 300 is similar to the IMC 200 (FIG. 2A) except that the IMC 300 includes a circuit 202C. The circuit 202C is adjacent to the circuit 202A. For example, there is no circuit, e.g., the circuit 202B, etc., between the circuits 202A and 202C. The circuit 202C is connected at an input, e.g., an end E4, etc., of the IMC 300 to an output of the x MHz RF generator. The circuit 202C includes a shunt circuit element 302A and a series circuit element 302B. The circuit 202C is connected to the RF transmission line 116 (FIG. 1A) via the end E3 of the IMC 270.

The RF signal generated by the x MHz RF generator is transferred via the circuit 202C and is combined with the RF signals that are transferred via the circuits 202A and 202B at the end E3. Similarly, the RF signal that is reflected from the plasma chamber 110 (FIG. 1A) via the RF transmission line 116 is split between the circuits 202A, 202B, and 202C. A portion of the RF signal that is reflected is transferred via the end E4 and the circuit 202C towards the x MHz RF generator. Moreover, an effect of an RF signal that is transferred via the circuit 202C is reduced by tuning, e.g., modifying characteristics of, etc., the tuning elements of the circuit 202A.

Figure 3B:
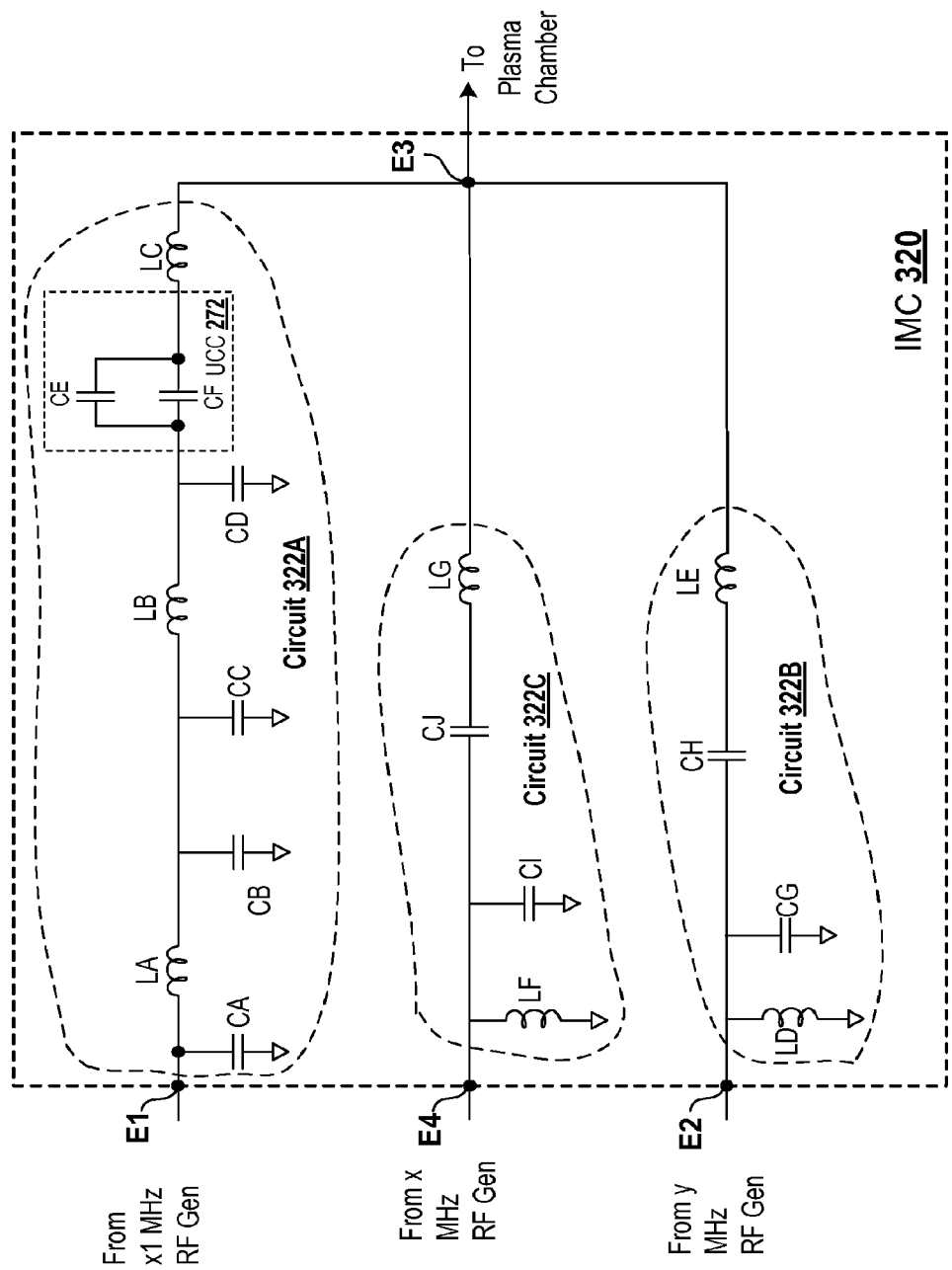
FIG. 3B is a circuit diagram of an embodiment of an IMC, which is an example of the IMC of FIG. 3A, to illustrate an embodiment of a UCC.

FIG. 3B is a circuit diagram of an embodiment of an IMC 320, which is an example of the IMC 300 of FIG. 3A. The IMC 320 includes a circuit 322A, a circuit 322B, and a circuit 322C. The circuit 322A is an example of the circuit 202A (FIG. 3A), the circuit 322B is an example of the circuit 202B (FIG. 3A), and the circuit 322C is an example of the circuit 202C (FIG. 3A). The circuit 322A is similar to the circuit 274A of FIG. 2B-1 except that the circuit 322A includes a fixed capacitor CB instead of the variable capacitor VCB of FIG. 2B-1. Moreover, the circuit 322B is similar to the circuit 274B except that the circuit 322B includes a fixed capacitor CG instead of the variable capacitor VCG of FIG. 2B-1 and includes a fixed capacitor CH instead of the variable capacitor VCH of FIG. 2B-1.

The circuit 322C includes an inductor LF, a capacitor CI, a capacitor CJ, and an inductor LG. A parallel circuit formed by the inductor LF and the capacitor CI is an example of the shunt circuit element 302A (FIG. 3A), and a series circuit element formed by a combination of the capacitor CJ and the inductor LG is an example of the series circuit element 302B (FIG. 3A).

In one embodiment, instead of the fixed capacitor CB, a variable capacitor is used. Moreover, in this embodiment, instead of the fixed capacitor CI, a variable capacitor is used and instead of the fixed capacitor CJ, a variable capacitor is used.

In one embodiment, instead of the fixed capacitor CB, a variable capacitor is used. Moreover, in this embodiment, instead of the fixed capacitor CG, a variable capacitor is used and instead of the fixed capacitor CH, a variable capacitor is used.

In an embodiment, instead of any of the capacitors CA, CB, CC, CD, CI, CJ, CG, and CH, a variable capacitor is used. In one embodiment, instead of any of the inductors LA, LB, LC, LF, LG, LD, and LE, a variable inductor is used.

Figure 4A:
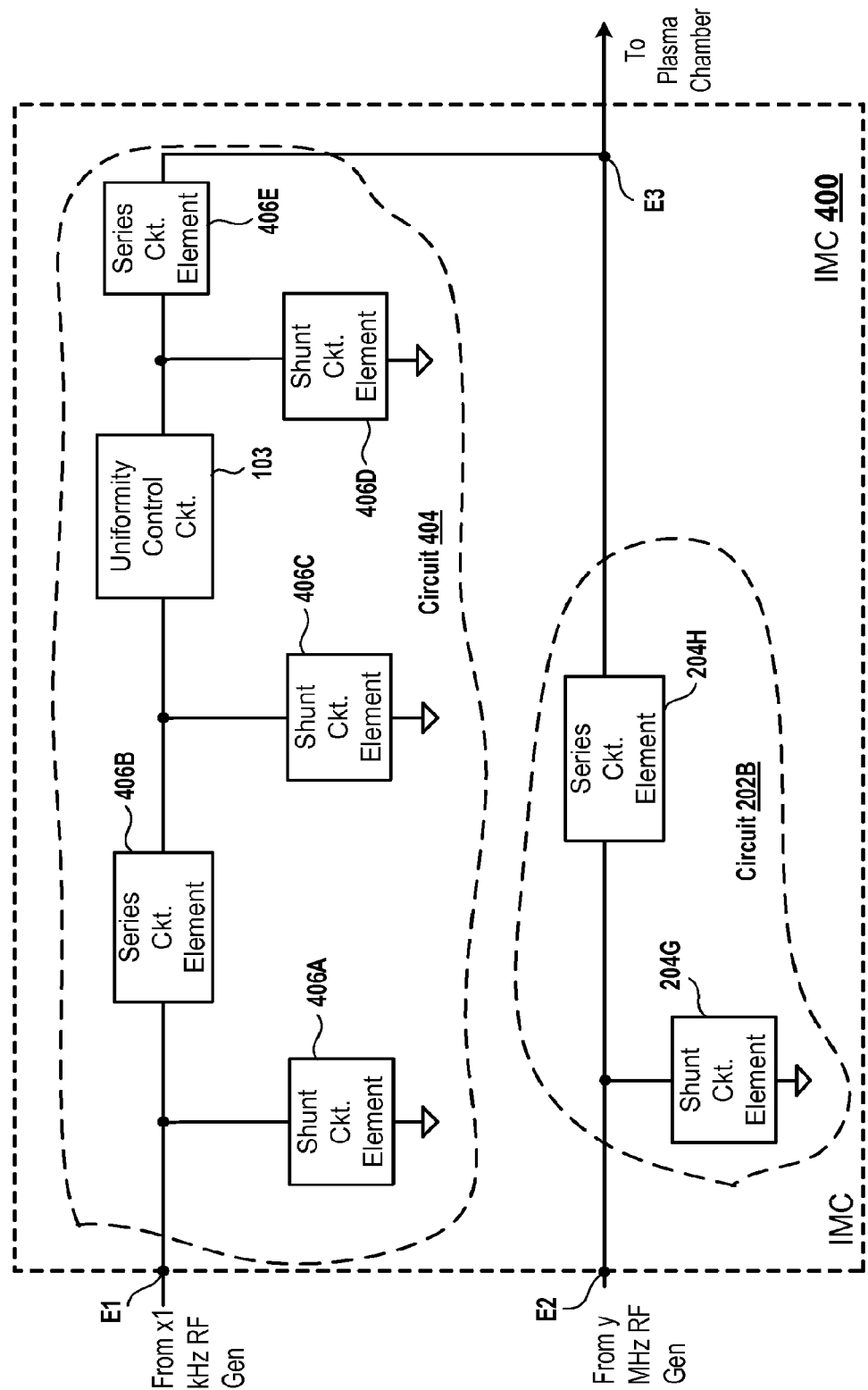
FIG. 4A is a diagram of an embodiment of an IMC to illustrate a change in a position of a UCC within a circuit of an IMC compared to a position of a UCC within a circuit of an IMC of FIG. 2A.

FIG. 4A is a diagram of an embodiment of an IMC 400 to illustrate a change in a position of the UCC 103 within a circuit 404 of an IMC 400 compared to a position of the UCC 103 (FIG. 2A) within the circuit 202A of FIG. 2A. The IMC 400 includes the circuit 404 and the circuit 202B. The circuit 404 is connected at the end E1 to the x1 kHz RF generator and the circuit 202B is connected at the end E2 to the y MHz RF generator. Both the circuits 404 and 202B are connected at the end E3 to the RF transmission line 106 (FIG. 1A), which is further connected to the plasma chamber 110 (FIG. 1A). The circuit 404 includes a shunt circuit element 406A, a series circuit element 406B, a shunt circuit element 406C, the UCC 103, a shunt circuit element 406D, and a series circuit element 406E. The circuit 404 is adjacent to the circuit 202B.

The UCC 103 is connected between the shunt circuit element 406C and the shunt circuit element 406D. For example, the UCC 103 is connected to a node of the shunt circuit element 406C and a node of the shunt circuit element 406D. The UCC 103 is connected serially with the series circuit element 406B and the series circuit element 406E. Also, the UCC 103 is connected between the series circuit element 406B and the series circuit element 406E. For example, the UCC 103 is connected to a node of the series circuit element 406B and a node of the series circuit element 406E. Furthermore, the UCC 103 is connected between the series circuit element 406B and the shunt circuit element 406D and between the series circuit element 406E and the shunt circuit element 406C. For example, the UCC 103 is connected to a node of the series circuit element 406E and a node of the shunt circuit element 406C.

A capacitance of the UCC 103 of the circuit 404 is controlled, either manually by a user or by the host system (FIG. 1A), to modify or set the one or more pre-determined values of the one or more parameters. Moreover, characteristics of remaining tuning elements, e.g., the shunt circuit element 406A, the series circuit element 406B, the shunt circuit element 406C, the shunt circuit element 406D, and/or the series circuit element 406E, etc., of the circuit 404 are changed, either manually by a user or by the host system (FIG. 1A), to achieve the pre-determined amount of isolation of an RF signal transferred via the circuit 404 from an RF signal transferred via the circuit 202B. An example of the RF signal transferred via the circuit 404 includes an RF signal that is generated and sent from the x1 kHz RF generator and sent via the circuit 404 to the end E3 to further be sent via the RF transmission line 106 (FIG. 1A) to the plasma chamber 110 (FIG. 1A). Another example of the RF signal transferred via the circuit 404 includes an RF signal that is reflected from the plasma within the plasma chamber 110 via the RF transmission line 116 and the circuit 404 to the end E1 and further via the RF cable 112A (FIG. 1A) to the x1 kHz RF generator. Also, the characteristics of the remaining tuning elements of the circuit 404 are changed to achieve the pre-determined amount of power delivered by the x1 kHz RF generator. The characteristics of the remaining tuning elements are changed either at the same time during which the characteristics of the UCC 103 are changed or after the characteristics of the UCC 103 are changed.

In one embodiment, the characteristics of the remaining tuning elements of the circuit 404 are changed so that an amount of isolation within a pre-determined threshold from the pre-determined amount of isolation from the MHz RF signal transferred via the second circuit 202B is achieved. Moreover, the characteristics of the remaining tuning elements of the circuit 404 are changed so that an amount of delivered power within a pre-determined threshold from the pre-determined amount of power delivered from the x1 kHz RF generator to the chuck 108 is achieved.

Figure 4B:
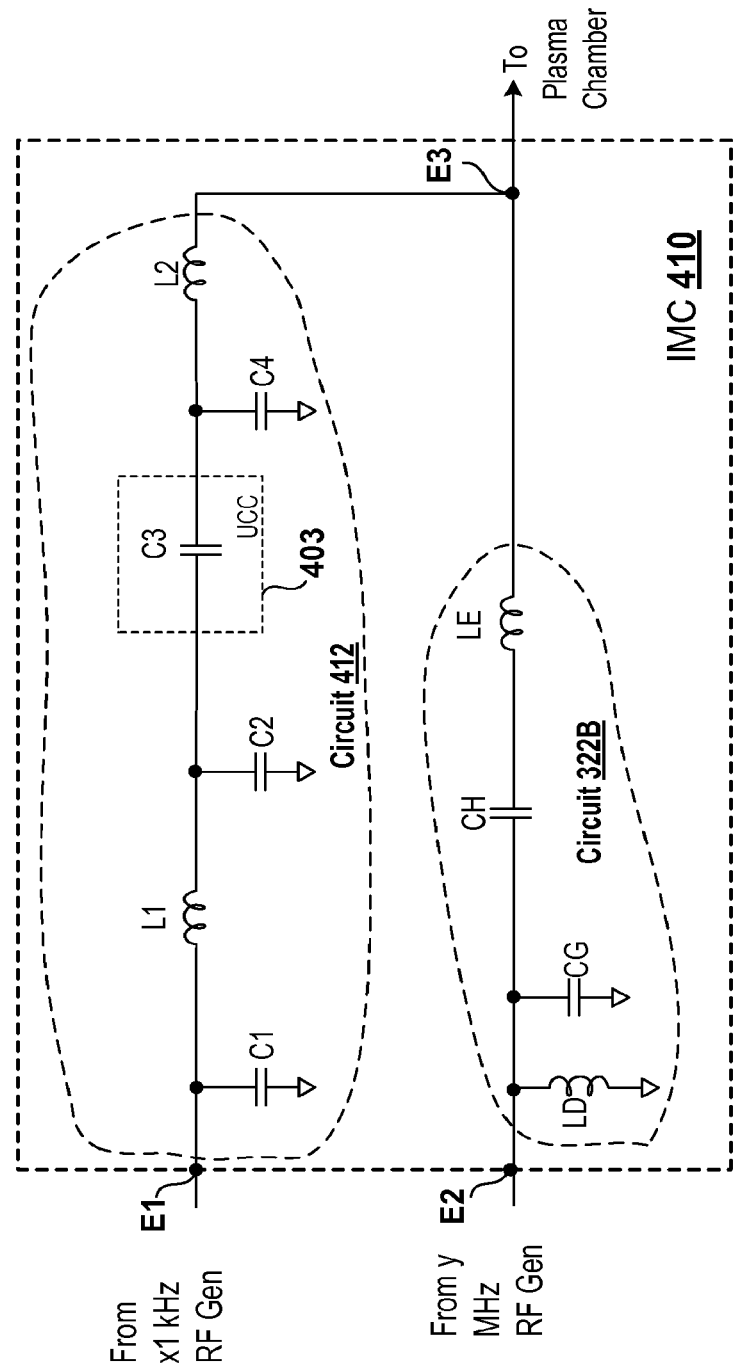
FIG. 4B is a circuit diagram of an embodiment of an IMC, which is an example of the IMC of FIG. 4A, to illustrate an example of a UCC.

FIG. 4B is a circuit diagram of an embodiment of an IMC 410, which is an example of the IMC 400 (FIG. 4A), to illustrate an example of a UCC. The IMC 410 includes a circuit 412, which is an example of the circuit 404 (FIG. 4A). The circuit 412 includes a capacitor C1, an inductor L1, a capacitor C2, a capacitor C3, a capacitor C4, and an inductor L2. The capacitor C3 is a UCC 403, which is an example of the UCC 103 (FIG. 4A). A capacitance of the capacitor C3 is fixed, e.g., is changeable manually by the user and not by the host system and the actuator 109 (FIG. 1A), etc.

The capacitor C1 is an example of the shunt circuit element 406A (FIG. 4A), the inductor L1 is an example of the series circuit element 406B (FIG. 4A), the capacitor C2 is an example of the shunt circuit element 406C (FIG. 4A), the capacitor C4 is an example of the shunt circuit element 406D (FIG. 4A), and the inductor L2 is an example of the series circuit element 406E (FIG. 4A).

In one embodiment, instead of the capacitor C3, multiple capacitors in series are used or multiple capacitors in parallel are used to form the UCC 403.

In an embodiment, instead of any of the fixed capacitors C1, C2, and C4, a variable capacitor is used. In one embodiment, instead of any of the fixed inductors L1 and L2, a variable inductor is used.

Figure 4C:
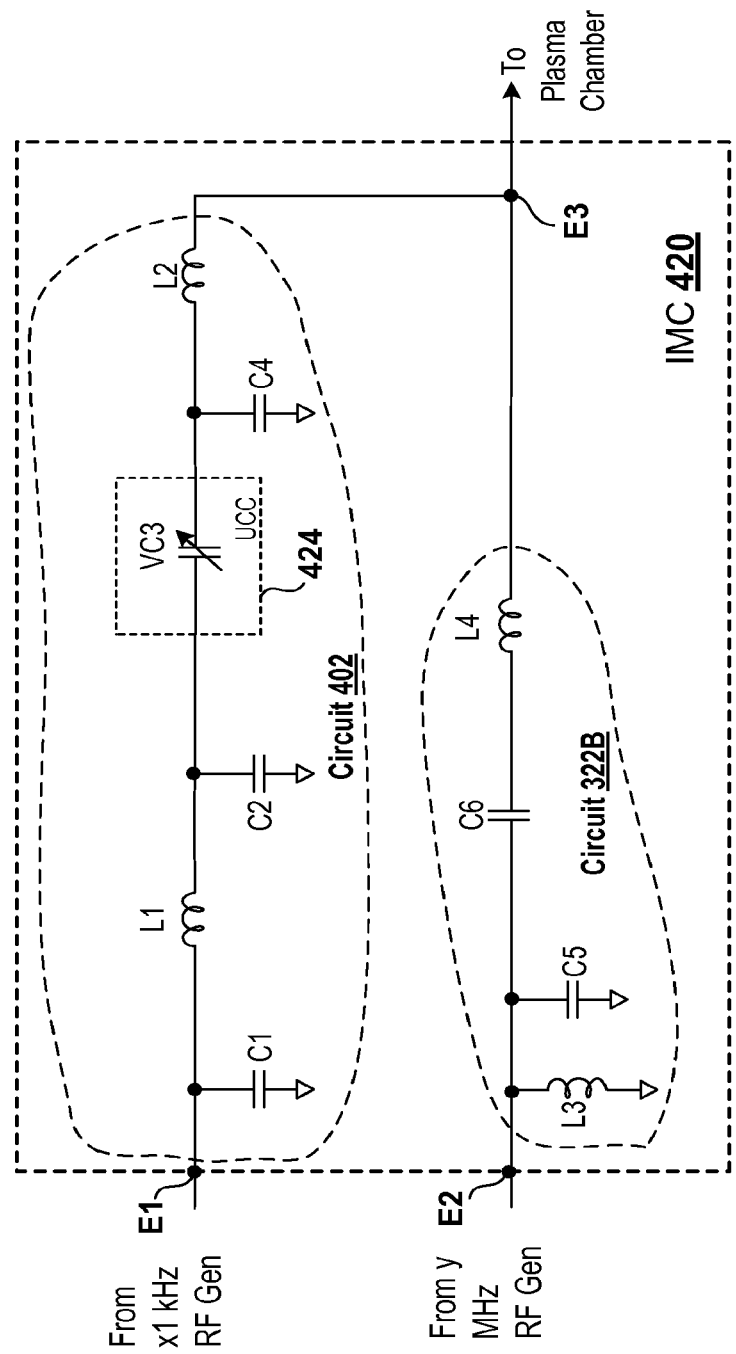
FIG. 4C is a circuit diagram of an embodiment of an IMC, which is an example of the IMC of FIG. 4A, to illustrate an example of a UCC.

FIG. 4C is a circuit diagram of an embodiment of an IMC 420, which is an example of the IMC 400 (FIG. 4A), to illustrate an example of a UCC. The IMC 420 is similar to the IMC 410 in structure except that the IMC 420 includes a variable capacitor VC3, which is a UCC 424. The UCC 424 is an example of the UCC 103 (FIG. 4A). The variable capacitor VC3 has a capacitance that is varied by the host system via the actuator 109.

In one embodiment, instead of the variable capacitor VC3, multiple variable capacitors are connected in series or in parallel with each other to form the UCC 424.

Figure 4D:
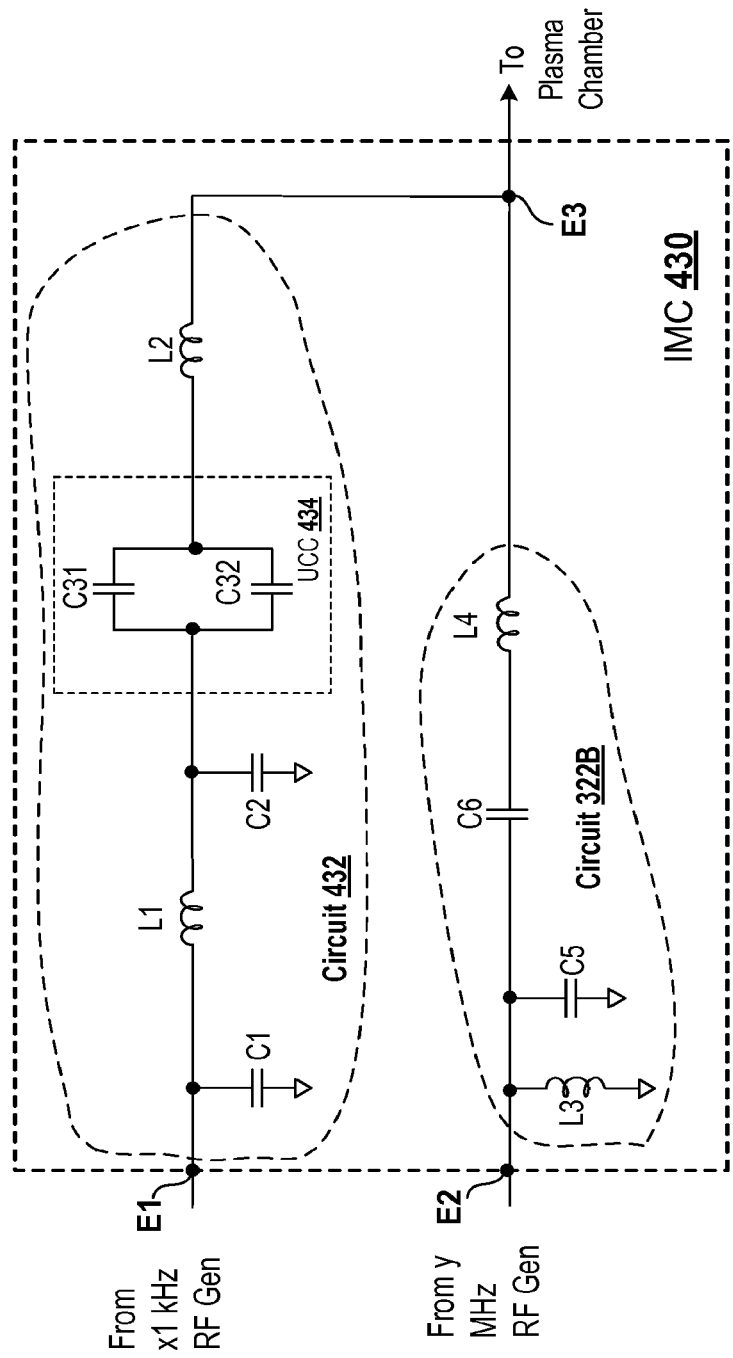
FIG. 4D is a circuit diagram of an embodiment of an IMC, which is an example of the IMC of FIG. 4A, to illustrate an example of a UCC.

FIG. 4D is a circuit diagram of an embodiment of an IMC 430, which is an example of the IMC 400 (FIG. 4A), to illustrate an example of a UCC. The IMC 430 includes a circuit 432 and the circuit 322B. The IMC 430 is similar in structure to that of the IMC 410 (FIG. 4B) except that the IMC 400 includes two capacitors C31 and C32, which is a UCC 434. The UCC 434 is an example of the UCC 103 (FIG. 4A). The capacitors C31 and C32 are coupled in parallel with each other and are fixed, e.g., have fixed capacitances, etc. In an embodiment, each capacitor C31 and C32 has the same capacitance. In one embodiment, the capacitors C31 and C32 have different capacitances.

Figure 4E:
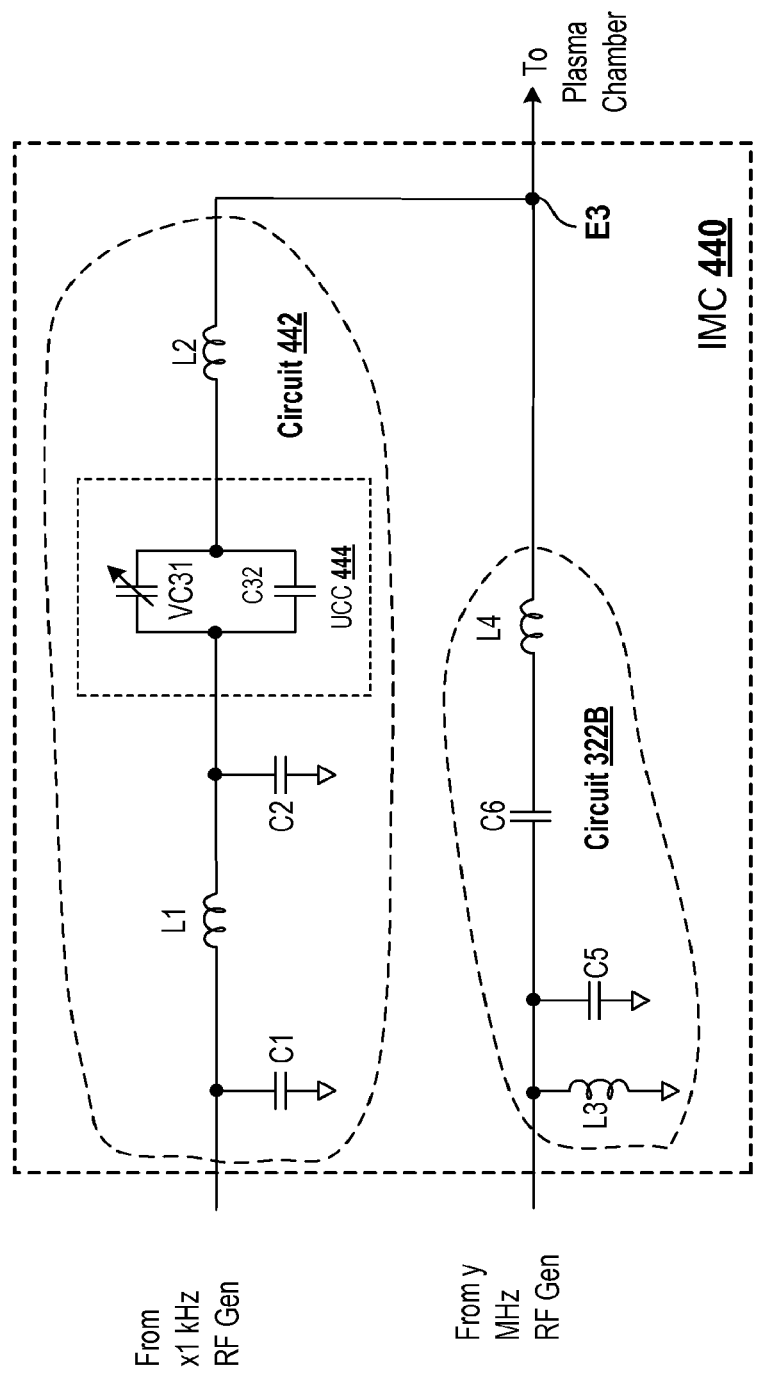
FIG. 4E is a circuit diagram of an embodiment of an IMC, which is an example of the IMC of FIG. 4A, to illustrate an example of a UCC.

FIG. 4E is a circuit diagram of an embodiment of an IMC 440, which is an example of the IMC 400 (FIG. 4A), to illustrate an example of a UCC. The IMC 440 includes a circuit 442 and the circuit 322B. The IMC 440 is similar to the IMC 430 (FIG. 4D) except that a UCC 444 of the IMC 440 includes a variable capacitor VC31 in parallel with the capacitor C32. The UCC 444 is an example of the UCC 103 (FIG. 4A). A capacitance of the variable capacitor VC31 is adjusted or set by the host system via the actuator 109 to further adjust or set one or more values of the one or more parameters.

In one embodiment, instead of the fixed capacitor C32, a variable capacitor is used in the UCC 444.

In an embodiment, instead of the fixed capacitor C32, any number of fixed capacitors are coupled to each other in series or in parallel with each other. In one embodiment, instead of the variable capacitor VC31, any number of variable capacitors are coupled to each other in series or in parallel with each other.

Figure 5:
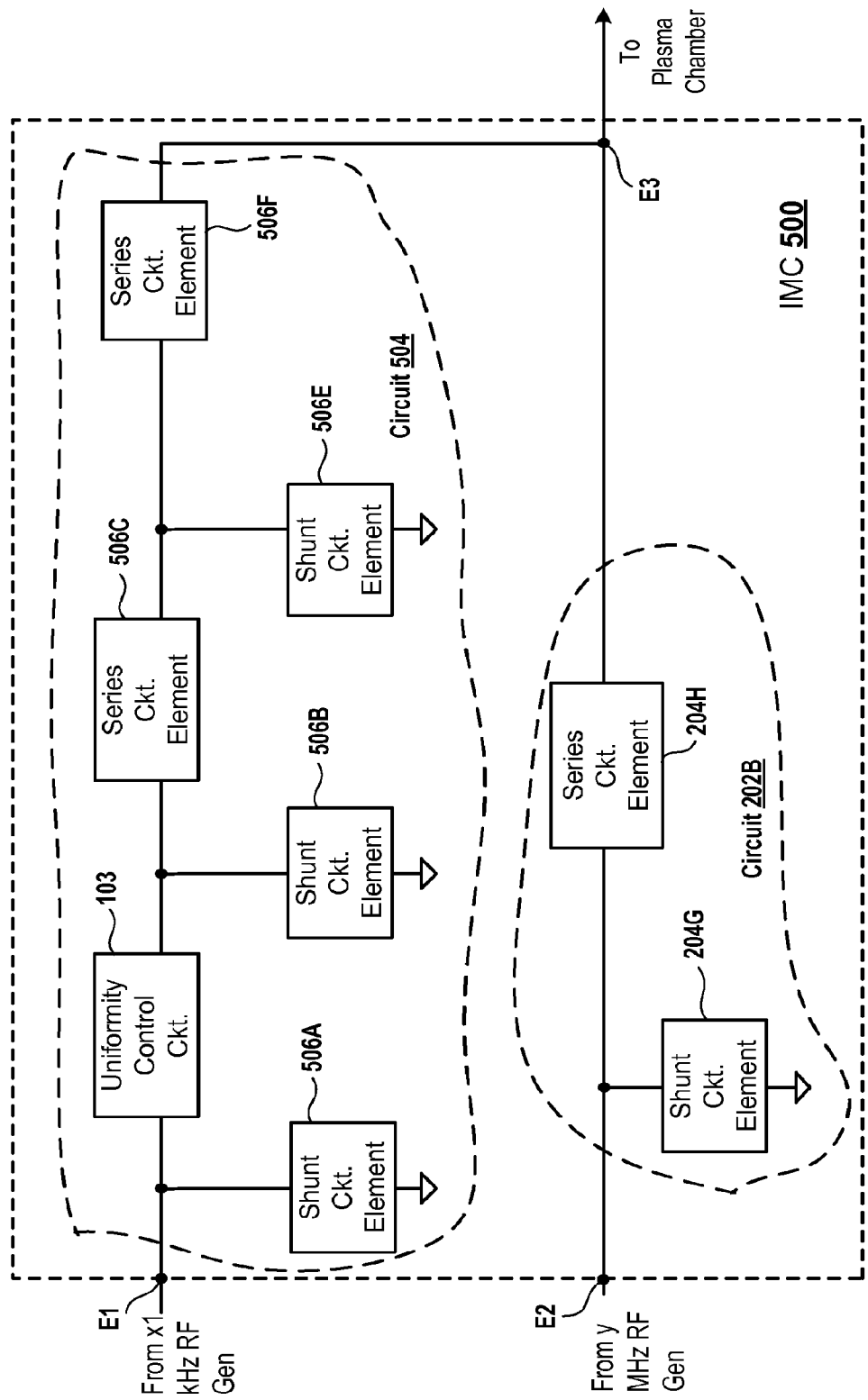
FIG. 5 is a diagram of an embodiment of an IMC to further illustrate a change in position of a UCC of the IMC compared to a position of a UCC within the circuit of FIG. 4A and a position of the UCC within the circuit of FIG. 2A.

FIG. 5 is a diagram of an embodiment of an IMC 500 to further illustrate a change in position of the UCC 103 of the IMC 500 compared to a position of the UCC 103 (FIG. 4A) within the circuit 404 of FIG. 4A and a position of the UCC 103 (FIG. 2A) within the circuit 202A of FIG. 2A. The IMC 500 includes a circuit 504 and the circuit 202B. The circuit 504 includes a shunt circuit element 506A, the UCC 103, a shunt circuit element 506B, a series circuit element 506C, a shunt circuit element 506E, and a series circuit element 506F. The circuit 504 is adjacent to the circuit 202B. The circuit 504 is connected between the ends E1 and E3.

The UCC 103 is located between the shunt circuit element 506A and the shunt circuit element 506B. For example, the UCC 103 is connected to a node of the shunt circuit element 506A and a node of the shunt circuit element 506B. Moreover, the UCC 103 is connected between the series circuit element 506C and the shunt circuit element 506A. For example, the UCC 103 is connected to a node of the series circuit element 506C and to a node of the shunt circuit element 506A. The UCC 103 is connected serially with the series circuit element 506C and to the end E1.

In an embodiment, the UCC 103 includes one or more fixed capacitors, e.g., two or more capacitors coupled to each other in series, two or more capacitors coupled to each other in parallel, etc. In one embodiment, the UCC 103 includes one or more variable capacitors, e.g., two or more variable capacitors coupled to each other in series, two or more variable capacitors coupled to each other in parallel, etc.

In an embodiment, the UCC 103 includes a fixed capacitor and a variable capacitor. The fixed capacitor is coupled in parallel with the variable capacitor. In one embodiment, the fixed capacitor is coupled in series with the variable capacitor. In an embodiment, instead of the fixed capacitor, any number of fixed capacitors that are coupled to each other in series or in parallel are used. In one embodiment, instead of the variable capacitor, any number of variable capacitors that are coupled to each other in series or in parallel are used.

A capacitance of the UCC 103 is adjusted or set, either manually or by the host controller via the actuator 109, to set one or more values of the one or more parameters. Moreover, simultaneous with the adjustment or setting of the capacitance of the UCC 103, characteristics of one or more of remaining tuning elements of the circuit 504, e.g., the shunt circuit element 506A, the shunt circuit element 506B, the series circuit element 506C, the shunt circuit element 506E, and the series circuit element 506F, etc., are adjusted to achieve the pre-determined amount of isolation from an RF signal that is transferred via the circuit 202B and to achieve the pre-determined amount of power delivered by the x1 kHz RF generator.

In one embodiment, after the adjustment or setting of the capacitance of the UCC 103, characteristics of one or more of the remaining tuning elements of the circuit 504 are adjusted to achieve the pre-determined amount of isolation from an RF signal that is transferred via the circuit 202B and to achieve the pre-determined amount of power delivered by the x1 kHz RF generator.

In an embodiment, the characteristics of the remaining tuning elements of the circuit 504 are changed so that an amount of isolation within a pre-determined threshold from the pre-determined amount of isolation from the MHz RF signal transferred via the second circuit 202B is achieved. Moreover, the characteristics of the remaining tuning elements of the circuit 504 are changed so that an amount of delivered power within a pre-determined threshold from the pre-determined amount of power delivered from the x1 kHz RF generator to the chuck 108 is achieved.

Figure 6:
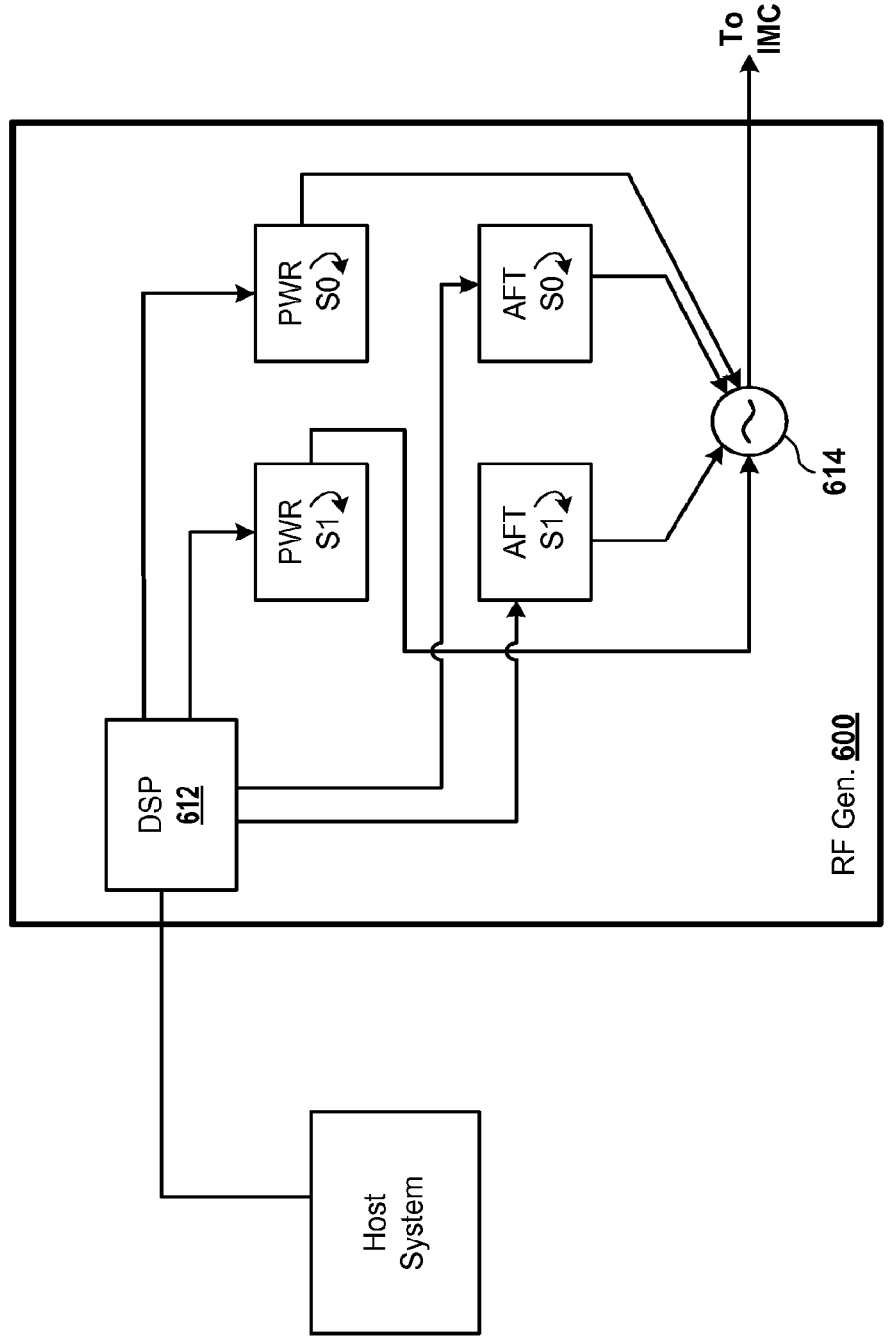
FIG. 6 is a diagram of an embodiment of an RF generator that is operated in multiple states.

FIG. 6 is a diagram of an embodiment of an RF generator 600 that is operated in multiple states, e.g., a state S1, a state S0, etc. The RF generator 600 includes a DSP 612, a power controller PWRS1 for the state S1, a power controller PWRS0 for the state S0, an auto-frequency tuner AFTS1 for the state S1, and an auto-frequency tuner AFTS0 for the state S0. The RF generator 600 is an example of any of the x1 kHz RF generator, the x MHz RF generator, and the y MHz RF generator. The processor of the host system provides to the DSP 612, power levels and timings for the states S1 and S0 via a communication device of the host system, a cable connecting the DSP 612 to the host system, and a communication device of the RF generator 600. In one embodiment, a communication device is a serial interface, a parallel interface, a universal serial bus (USB) interface, or a network interface controller, etc.

The DSP 612 receives the power levels and timings for the states S1 and S0 from the communication device of the RF generator 600, and identifies a power level and timings for the state S0 and a power level and timings for the state S1. For example, the DSP 612 distinguishes the power level and timings for the state S0 from the power level and timings for the state S1.

During the state S1, the DSP 612 sends the power level and timings for the state S1 to a power controller PWRS1 of the RF generator 600. Moreover, during the state S0, the DSP 612 sends the power level and timings for the state S0 to a power controller PWRS0 of the RF generator 600. Each power controller PWRS1 and PWRS0 drives, e.g., via a transistor, one or more transistors, etc., an RF power supply 614 of the RF generator 600. For example, the power controller PWRS1 drives the RF power supply 614 during the state S1 by providing the power level and timings for the state S1 to the RF power supply 614, and the power controller PWRS0 drives the RF power supply 614 during the state S0 by providing the power level and timings for the state S0 to the RF power supply 614. The RF power supply 614 is driven during the states S1 and S0 to generate an RF pulse signal that switches between the states S1 and S0, e.g., between the two power levels, etc. The RF pulse signal is sent via an RF cable that is connected to an output of the RF generator 600 to the IMC 104 (FIG. 1A). It should be noted that in one embodiment, the states S0 and S1 are states of a clock signal that is supplied to the DSP 612. For example, the host system supplies the clock signal having the states S1 and S0 to the DSP 612.

In one embodiment, all power amounts included in a power level for the state S0 are lower than power amounts included in a power level of the state S1. For example, the state S1 is a high state and the state S0 is a low state. As another example, the state S1 is a state 1, e.g., a high state, identified by a bit 1, etc., and the state S0 is a state 0, e.g., a low state, identified by a bit 0, etc.

In one embodiment, the RF generator 600 is modified to operate is more than two states, e.g., three states, four states, etc.

In an embodiment, during the state S0, a deposition operation is primarily performed on the substrate 120 (FIG. 1A) and during the state S1, an etch operation is primarily performed on the substrate 120.

Figure 7:
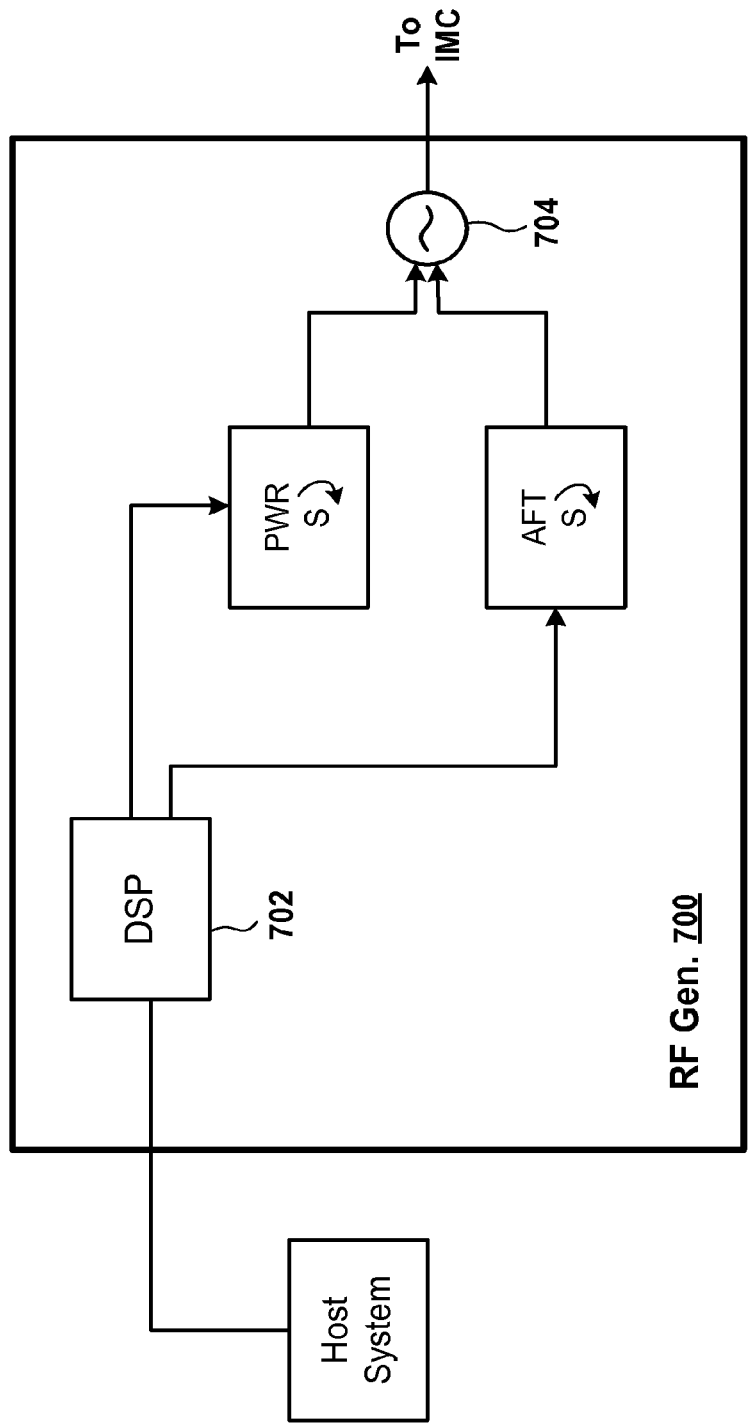
FIG. 7 is a diagram of an embodiment of an RF generator that is operated in a continuous wave single state.

FIG. 7 is a diagram of an embodiment of an RF generator 700 that is operated in a single state, e.g., a state S, etc. The RF generator 700 includes a DSP 702, a power controller PWRS, and an auto-frequency tuner (AFT) AFTS. The RF generator 700 is an example of any of the x1 kHz RF generator, the x MHz RF generator, and the y MHz RF generator. The processor of the host system provides a power level via a communication device of the host system and a communication device of the RF generator 700 to the DSP 702. The DSP 702 receives the power level for the state S, and identifies that the power level is associated with the state S.

The DSP 702 sends the power level to the power controller PWRS of the RF generator 700. The power controller PWRS drives, e.g., via a transistor, one or more transistors, etc., an RF power supply 704 of the RF generator 700. The RF power supply 704 is driven during the state S to generate an RF continuous wave signal, which is sent via an RF cable connected to an output of the RF generator 700 to the IMC 104 (FIG. 1A). The continuous wave signal has a power level and does not have multiple power levels, e.g., does not switch between the two states S1 and S0, etc.

Figure 8A:
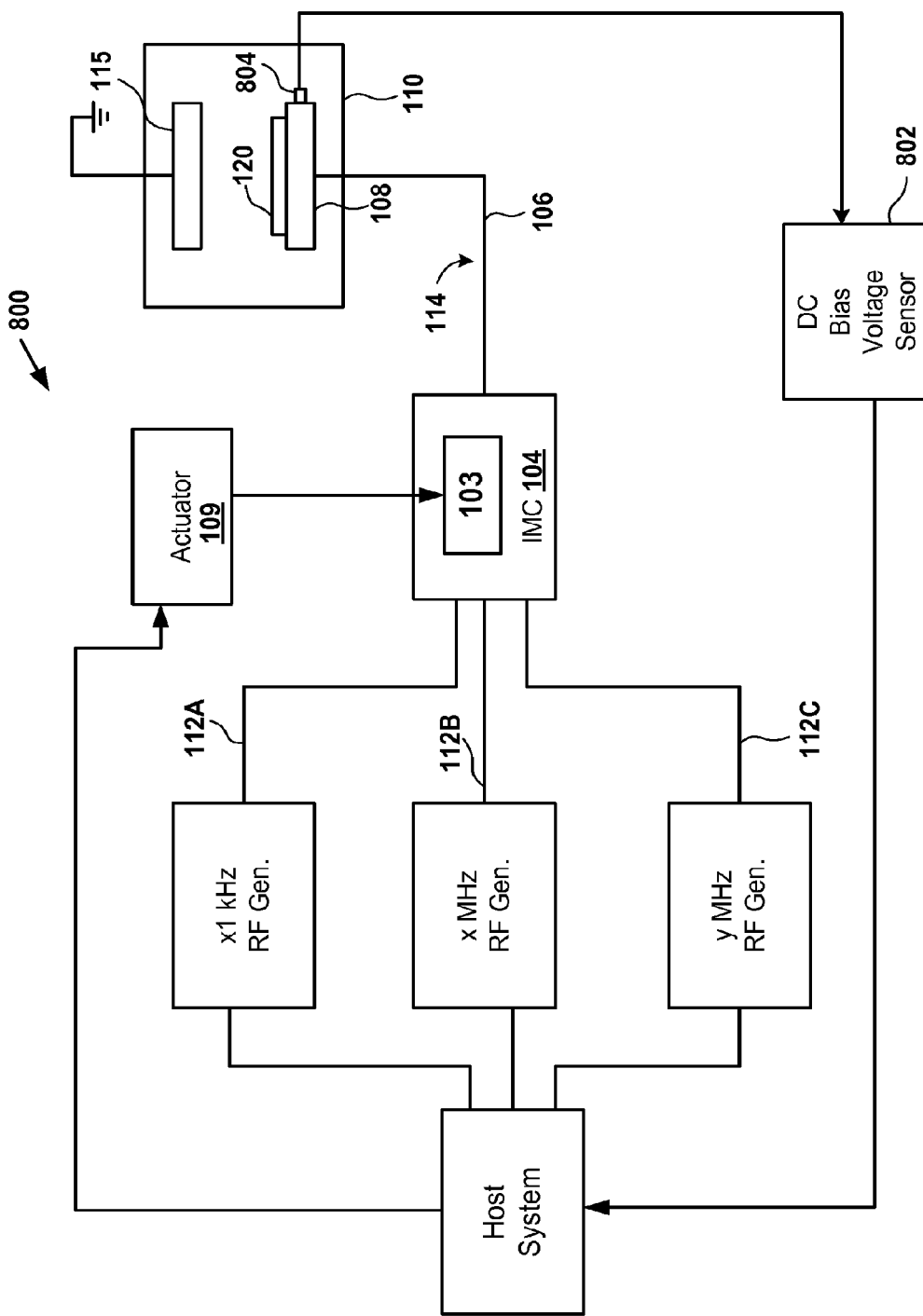
FIG. 8A is a block diagram of an embodiment of a plasma system to illustrate use of a DC bias voltage sensor and an electrode to measure a wafer DC bias and use of a capacitance of a UCC to modify the wafer DC bias.

FIG. 8A is a block diagram of an embodiment of a plasma system 800 to illustrate use of a DC bias voltage sensor 802 and an electrode 804, e.g., a DC voltage pickup pin, etc., to measure DC bias voltage, of the substrate 120, at the chuck 108. The electrode 804 is attached, e.g., soldered, etc., to a side surface of the chuck 108. The electrode 804 is connected to the DC bias voltage sensor 802. The substrate 120 is DC biased, e.g., has a DC potential, etc., when plasma is generated and/or maintained in the plasma chamber 110.

The electrode 804 captures an electrical signal from the chuck 108 when the substrate 120 is DC biased. The electrical signal is representative of an amount of the wafer DC bias voltage. The DC bias voltage sensor 802 receives the electrical signal and generates a measured value of the wafer DC bias voltage, which is provided by the DC bias voltage sensor 802 to the processor of the host system.

The processor of the host system determines whether the measured DC bias voltage is within a pre-determined threshold of a pre-determined DC bias voltage. Upon determining that the measured DC bias voltage is not within the pre-determined threshold of the pre-determined DC bias voltage, the processor of the host system identifies an amount of current to be generated by a driver, e.g., one or more transistors, etc., of the actuator 109. The amount of current corresponds to a capacitance of the UCC 103. Moreover, the capacitance corresponds to, e.g., has a mapping relationship with, has a one-to-one correspondence relationship with, etc., a value of a wafer DC bias voltage, e.g., the pre-determined DC bias voltage, the pre-determined threshold of the pre-determined DC bias voltage, etc., to be set or achieved. The amount of current is embedded within a command signal and provided from the processor of the host system to the driver of the actuator 109. The driver of the actuator 109 drives the mechanical components of the actuator 109, e.g., by providing a current signal having the amount of current to a stator winding of the motor, etc. The mechanical components are actuated, e.g., rotated, turned, moved, etc., to achieve a capacitance of UCC 103, e.g., one or more capacitances of corresponding one or more variable capacitors of the UCC 103, etc. The capacitance of the UCC 103 is adjusted to achieve the capacitance that corresponds to the pre-determined threshold of the pre-determined DC bias voltage. The adjusted capacitance of the UCC 103 changes an impedance of the IMC 104 so that an RF signal that is supplied from the x1 kHz is modified by the IMC 104 to generate the modified signal 114, which is provided to the chuck 108 for processing the substrate 120.

In one embodiment, the processor of the host system identifies a capacitance that corresponds to a wafer DC bias voltage, e.g., the pre-determined DC bias voltage, the pre-determined threshold of the pre-determined DC bias voltage, etc., to be achieved and provides the capacitance to a display device of the host system for display. Examples of a display device include a plasma display device, a liquid crystal display, a light emitting diode display, etc. The user views the display device and changes one or more capacitors of the UCC 103, e.g., replaces one capacitor with another, connects additional capacitors to a capacitor of the UCC 103, removes capacitors from the UCC 103, etc., to achieve the capacitance of the UCC 103 that is displayed on the display device to further achieve the wafer DC bias voltage.

Figure 8B:
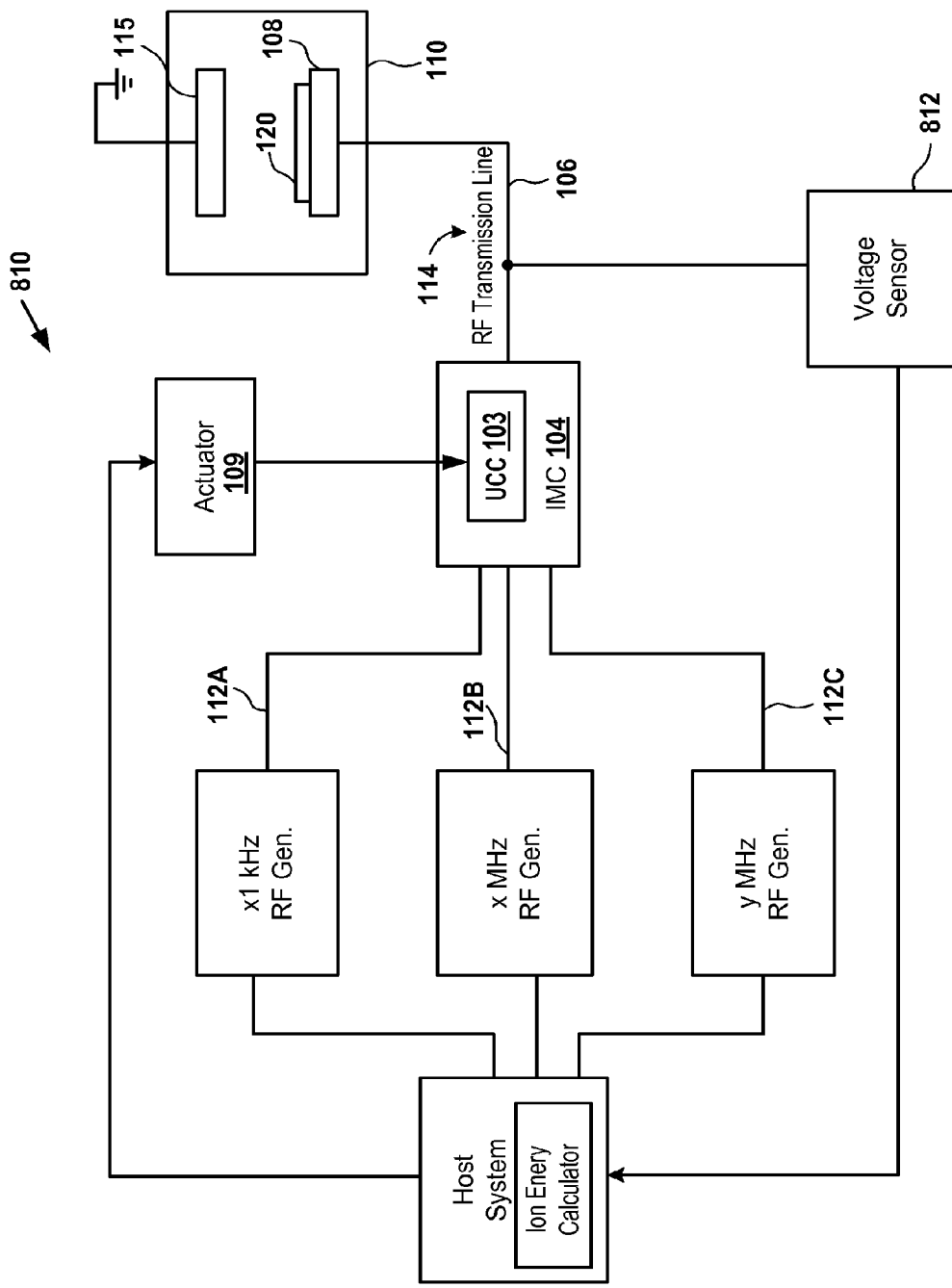
FIG. 8B is a diagram of an embodiment of a plasma system for illustrating use of RF rod potential to control a capacitance of a UCC.

FIG. 8B is a diagram of an embodiment of a plasma system 810 for illustrating use of an RF rod potential to control a capacitance of the UCC 103 of the IMC 104. The plasma system 800 is similar to the plasma system 100 (FIG. 1A) except that the plasma system 800 includes a voltage sensor 812 that measures an RF rod potential. The voltage sensor 812 is connected to an RF rod of the RF transmission line 106.

When the substrate 120 is being processed, e.g., etched, sputtered, deposited with monomers or polymers, etc., within the plasma chamber 110, the voltage sensor 812 measures an RF rod potential at a point on the RF rod. The measured RF rod potential is provided by the voltage sensor 812 to the processor of the host system. The processor of the host system compares the measured RF rod potential to a pre-determined rod potential to determine whether the measured RF rod potential is within a pre-determined threshold of the pre-determined rod potential.

Upon determining that the measured RF rod potential is not within the pre-determined threshold of the pre-determined rod potential, the processor of the host system identifies an amount of current to be generated by the driver of the actuator 109. The amount of current corresponds to a capacitance of the UCC 103. Moreover, the capacitance corresponds to a value of an RF rod potential, e.g., the pre-determined rod potential, the pre-determined threshold of the pre-determined rod potential, etc., to be set or achieved. The amount of current is provided within a command signal from the processor of the host system to the driver of the actuator 109. The driver of the actuator 109 drives the mechanical components of the actuator 109. The mechanical components are actuated to achieve a capacitance of UCC 103. The capacitance of the UCC 103 is adjusted to achieve the capacitance that corresponds to the pre-determined threshold of the pre-determined rod potential. The adjusted capacitance of the UCC 103 changes an impedance of the IMC 104 so that an RF signal that is supplied from the x1 kHz is modified by the IMC 104 to generate the modified signal 114, which is provided to the chuck 108 for processing the substrate 120.

In one embodiment, the processor of the host system identifies the capacitance that corresponds to an RF rod potential to be achieved, e.g., the pre-determined RF rod potential, the pre-determined threshold of the pre-determined RF rod potential, etc., and provides the capacitance to the display device of the host system for display. The user views the display device and changes one or more capacitors of the UCC 103 to achieve the capacitance of the UCC 103 that is displayed on the display device to further achieve the RF rod potential.

In one embodiment, instead or in addition to using an RF rod potential to change a capacitance of the UCC 103, the processor of the host system calculates an amount of ion energy to change the capacitance. The amount of ion energy is calculated by an ion energy calculator, which is executed by the processor of the host system. For example, the ion energy calculator calculates an ion energy distribution function (IEDF), designated as f (E), from the RF rod potential and a wafer DC bias voltage $V_{dc}$ by applying an equation:

$$f(E) \equiv \left(\frac{dV_{LF}}{dt}\right)^{-1}, \quad (1)$$

where $$V_{LF}(t) = \left[\left(\frac{V_{LFRF(PEAK)} - V_{dc}}{2}\right)^{1/2} - \left(\frac{V_{LFRF(PEAK)} - V_{dc}}{8}\right)^{1/2} \sin\omega t\right]^2 \quad (2)$$

In equation (2), $V_{LFRF(PEAK)}$ is a peak value of a low frequency RF voltage $V_{LF}$ supplied to the plasma chamber 110 and calculated by the processor of the host system from the RF rod potential, $V_{dc}$ is a wafer DC bias voltage that is measured in a manner described herein, t is time, and ω is a low frequency calculated by the processor of the host system. To illustrate, the frequency ω is calculated by filtering high frequencies from a voltage signal that is generated by the voltage sensor 812 (FIG. 8B) used to measure the RF rod potential. The filtering of the high frequencies is performed by the processor of the host system or by a filter. In one embodiment, the peak value $V_{LFRF(PEAK)}$ is calculated by the processor of the host system from voltages measured using a voltage sensor that is connected to the chuck 108.

The processor of the host system determines whether the calculated ion energy is within a pre-determined threshold of a pre-determined amount of ion energy. Upon determining that the calculated ion energy is not within the pre-determined threshold of the pre-determined ion energy, the processor of the host system identifies an amount of current to be generated by the driver of the actuator 109. The amount of current corresponds to a capacitance of the UCC 103. Moreover, the capacitance corresponds to a value of an ion energy, e.g., the pre-determined amount of ion energy, the pre-determined threshold of the pre-determined amount of ion energy, etc., to be set or achieved. The amount of current is provided within a command signal from the processor of the host system to the driver of the actuator 109. The driver of the actuator 109 drives the mechanical components of the actuator 109. The mechanical components are actuated to achieve a capacitance of UCC 103 in a manner described herein. The capacitance of the UCC 103 is adjusted to achieve the capacitance that corresponds to the pre-determined threshold of the pre-determined amount of ion energy. The adjusted capacitance of the UCC 103 changes an impedance of the IMC 104 so that an RF signal that is supplied from the x1 kHz is modified by the IMC 104 to generate the modified signal 114, which is provided to the chuck 108 for processing the substrate 120.

In one embodiment, the processor of the host system identifies the capacitance that corresponds to an amount of ion energy, e.g., the pre-determined ion energy, the pre-determined threshold of the pre-determined amount of ion energy, etc., to be achieved, and provides the capacitance to the display device of the host system for display. The user views the display device and changes one or more capacitors of the UCC 103 to achieve the capacitance of the UCC 103 that is displayed on the display device to further achieve the amount of ion energy.

FIG. 8C is a diagram of an embodiment of a plasma system 820 to illustrate use of capacitance of the UCC 103 to adjust or set a removal rate, e.g., an etch rate, a sputtering rate, etc., of removing materials, e.g., oxides, polymers, monomers, etc., from a surface of the substrate 120. The plasma system 820 is similar to the plasma system 100 (FIG. 1A) except that the plasma system 820 includes an optical thickness measurement device (OTMD) 822, e.g., an interferometer, etc., that is used to measure a thickness of the substrate 120 ex situ, e.g., when the substrate 120 is taken out of the plasma chamber 110. The substrate 120 is removed from the cavity of the plasma chamber 110 to measure a thickness of the substrate 120. The OTMD 822 measures a thickness of the substrate 120 and provides the thickness to the host system. The processor of the host system calculates based on the thickness and an amount of time passed since the substrate 120 is subjected to a removal operation, e.g., an etching operation, a sputtering operation, etc., in the plasma chamber 110, a removal rate of removing a material, e.g., oxide layer, mask layer, etc., that is deposited on the substrate 120.

The processor of the host system compares the calculated etch removal to a pre-determined removal rate. Upon determining that the calculated removal rate is not within a pre-determined threshold of the pre-determined removal rate, the processor of the host system identifies an amount of current to be generated by the driver of the actuator 109. The amount of current corresponds to a capacitance of the UCC 103. Moreover, the capacitance corresponds to a value of a removal rate, e.g., the pre-determined removal rate, the pre-determined threshold of the pre-determined removal rate, etc., to be set or achieved. The amount of current is provided within a command signal from the processor of the host system to the driver of the actuator 109. The driver of the actuator 109 drives the mechanical components of the actuator 109. The mechanical components are actuated to achieve a capacitance of UCC 103. For example, a plate of a capacitor of the UCC 103 is rotated with respect to another plate of the capacitor to achieve a capacitance of the capacitor. As another example, multiple plates of multiple capacitors of the UCC 103 are rotated with respect to corresponding plates of the capacitors to achieve capacitances of the capacitors. The capacitance of the UCC 103 is adjusted to achieve the capacitance that corresponds to the pre-determined threshold of the pre-determined removal rate. The adjusted capacitance of the UCC 103 changes an impedance of the IMC 104 so that an RF signal that is supplied from the x1 kHz is modified by the IMC 104 to generate the modified signal 114, which is provided to the chuck 108 for processing the substrate 120.

In one embodiment, the processor of the host system identifies a capacitance that corresponds to a removal rate, e.g., the pre-determined removal rate, the pre-determined threshold of the pre-determined removal rate, etc., to be achieved and provides the capacitance to the display device of the host system for display. The user views the display device and changes one or more capacitors of the UCC 103 to achieve the capacitance of the UCC 103 that is displayed on the display device to further achieve the removal rate.

FIG. 8D is a block diagram of an embodiment of a plasma system 830 to illustrate use of an ion saturation current density in controlling a capacitance of the UCC 103. The plasma system 830 is similar to the plasma system 100 (FIG. 1A) except that the plasma system 830 includes a probe 832, e.g., a planar ion flux probe, a Langmuir probe, etc., and a current sensor 834 that is connected to the probe 832. The current sensor 852 is also coupled to the host system.

The probe 832 is immersed in plasma between electrodes the chuck 108 and the upper electrode 115. The probe 832 has a surface area, e.g., measured in square centimeters, etc., and is rotated within the plasma chamber 110. The probe 832 when rotates collects ion current within the plasma chamber 110 over the surface area of the probe 832 to generate electrical signals and provides the electrical signals to the current sensor 834.

The current sensor 834 measures an amount of current from the electrical signals and provides the amount of current to the processor of the host system. The processor of the host system calculates the amount of current per unit surface area of the probe 832 to calculate the ion saturation current density.

The processor of the host system compares the calculated ion saturation current density to a pre-determined ion saturation current density. Upon determining that the calculated ion saturation current density is not within a pre-determined threshold of the pre-determined ion saturation current density, the processor of the host system identifies an amount of current to be generated by the driver of the actuator 109. The amount of current corresponds to a capacitance of the UCC 103. Moreover, the capacitance corresponds to a value of an amount of ion saturation current density to be set or achieved, e.g., the pre-determined ion saturation current density, the pre-determined threshold of the pre-determined ion saturation current density, etc. The amount of current is provided within a command signal from the processor of the host system to the driver of the actuator 109. The driver of the actuator 109 drives the mechanical components of the actuator 109. The mechanical components are actuated to achieve a capacitance of UCC 103. For example, a plate of a capacitor of the UCC 103 is rotated with respect to another plate of the capacitor to achieve a capacitance of the capacitor. As another example, multiple plates of multiple capacitors of the UCC 103 are rotated with respect to corresponding plates of the capacitors to achieve capacitances of the capacitors. The capacitance of the UCC 103 is adjusted to achieve the capacitance that corresponds to the pre-determined threshold of the pre-determined ion saturation current density. The adjusted capacitance of the UCC 103 changes an impedance of the IMC 104 so that an RF signal that is supplied from the x1 kHz is modified by the IMC 104 to generate the modified signal 114, which is provided to the chuck 108 for processing the substrate 120.

In one embodiment, the processor of the host system identifies the capacitance that corresponds to an ion saturation current density to be achieved, e.g., the pre-determined ion saturation current density, the pre-determined threshold of the pre-determined ion saturation current density, etc., and provides the capacitance to the display device of the host system for display. The user views the display device and changes one or more capacitors of the UCC 103 to achieve the capacitance of the UCC 103 that is displayed on the display device to further achieve the ion saturation current density.

Figure 8E:
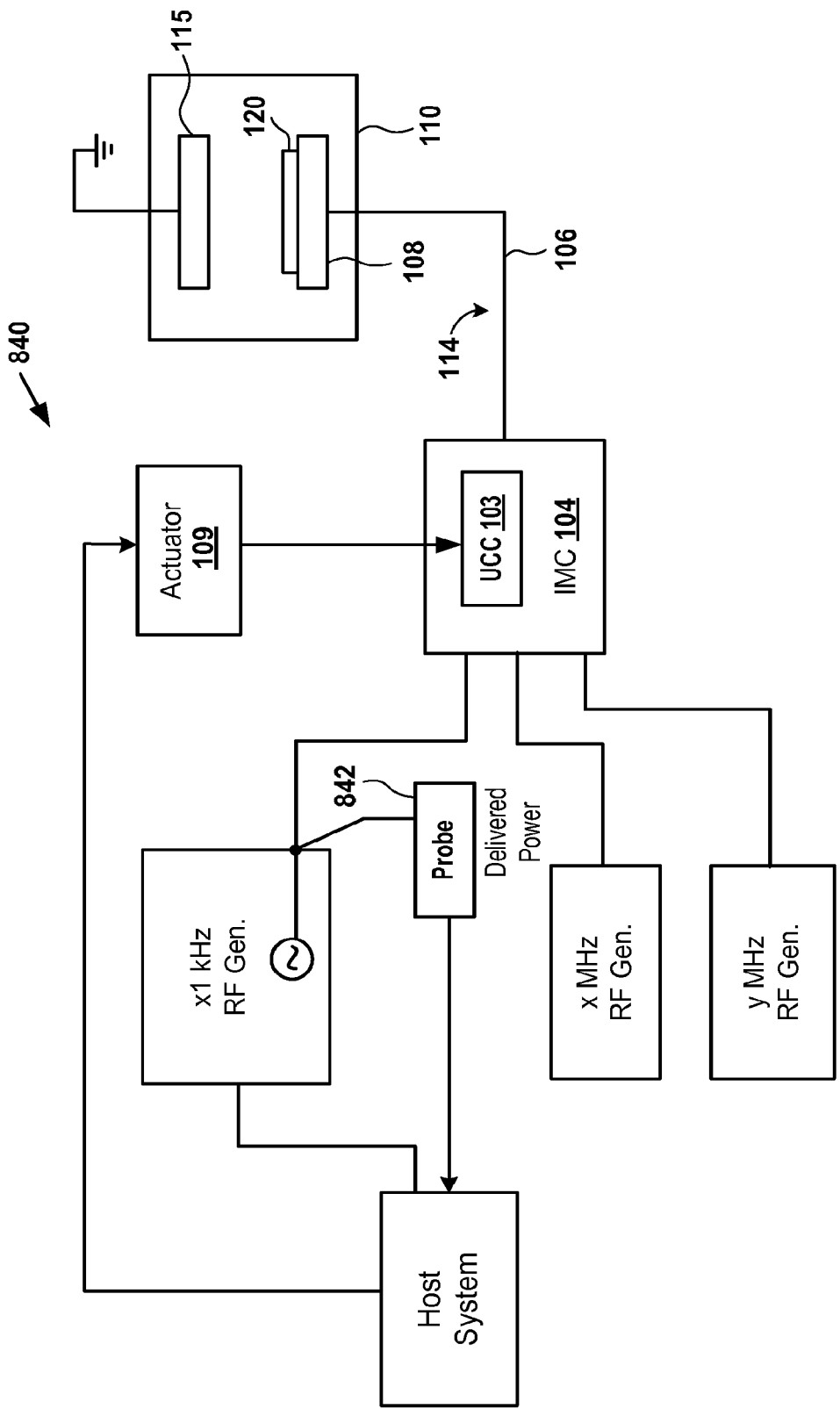
FIG. 8E is a block diagram of an embodiment of a plasma system to illustrate use of a UCC to control power delivered by an x1 kilohertz (kHz) RF generator.

FIG. 8E is a block diagram of an embodiment of a plasma system 840 to illustrate use of the UCC 103 to control power delivered by the x1 kHz RF generator. The plasma system 840 is similar to the plasma system 100 (FIG. 1A) except that the plasma system 830 includes a probe 842, e.g., a voltage and current probe, a delivered power measurement probe, etc., that is connected to an output of the x1 kHz RF generator. The probe is connected to an output of an RF power supply of the x1 kHz RF generator.

During processing of the substrate 120 within the plasma chamber 110, the probe 842 measures complex voltage and current and provides the complex voltage and current of an RF signal that is delivered by the x1 kHz RF generator to the plasma chamber 110 via the IMC 104. In one embodiment, the complex voltage and current includes a current magnitude, a voltage magnitude, and a phase between the current magnitude and the voltage magnitude. The processor of the host system calculates delivered power from the complex voltage and current, e.g. by calculating a product of complex voltage and complex current, etc.

The processor of the host system compares the calculated delivered power to a pre-determined delivered power, e.g., the pre-determined amount of delivered power, etc. Upon determining that the calculated delivered power is not within a pre-determined threshold of the pre-determined delivered power, the processor of the host system identifies an amount of current to be generated by the driver of the actuator 109. The amount of current corresponds to a capacitance of the UCC 103. Moreover, the capacitance corresponds to an amount of delivered power, e.g., the pre-determined delivered power, the pre-determined threshold of the pre-determined delivered power, etc., to be set or achieved. The amount of current is provided within a command signal from the processor of the host system to the driver of the actuator 109. The driver of the actuator 109 drives the mechanical components of the actuator 109. The mechanical components are actuated to achieve a capacitance of UCC 103. For example, a plate of a capacitor of the UCC 103 is rotated with respect to another plate of the capacitor to achieve a capacitance of the capacitor. As another example, multiple plates of multiple capacitors of the UCC 103 are rotated with respect to corresponding plates of the capacitors to achieve capacitances of the capacitors to further achieve a capacitance of the UCC 103. In the example, the capacitance of the UCC 103 is a combined capacitance, e.g., summed capacitance, etc., of the capacitors. The capacitance of the UCC 103 is adjusted to achieve the capacitance that corresponds to the pre-determined threshold of the pre-determined delivered power. The adjusted capacitance of the UCC 103 changes an impedance of the IMC 104 so that an RF signal that is supplied from the x1 kHz is modified by the IMC 104 to generate the modified signal 114, which is provided to the chuck 108 for processing the substrate 120. The delivered power at the output of the x1 kHz RF generator is power delivered to the plasma chamber 110.

In one embodiment, the processor of the host system identifies a capacitance that corresponds to an amount of delivered power, e.g., the pre-determined delivered power, the pre-determined threshold of the pre-determined delivered power, etc., to be achieved and provides the capacitance to the display device of the host system for display. The user views the display device and changes one or more capacitors of the UCC 103 to achieve the capacitance of the UCC 103 that is displayed on the display device to further achieve the amount of delivered power.

Figure 8F:
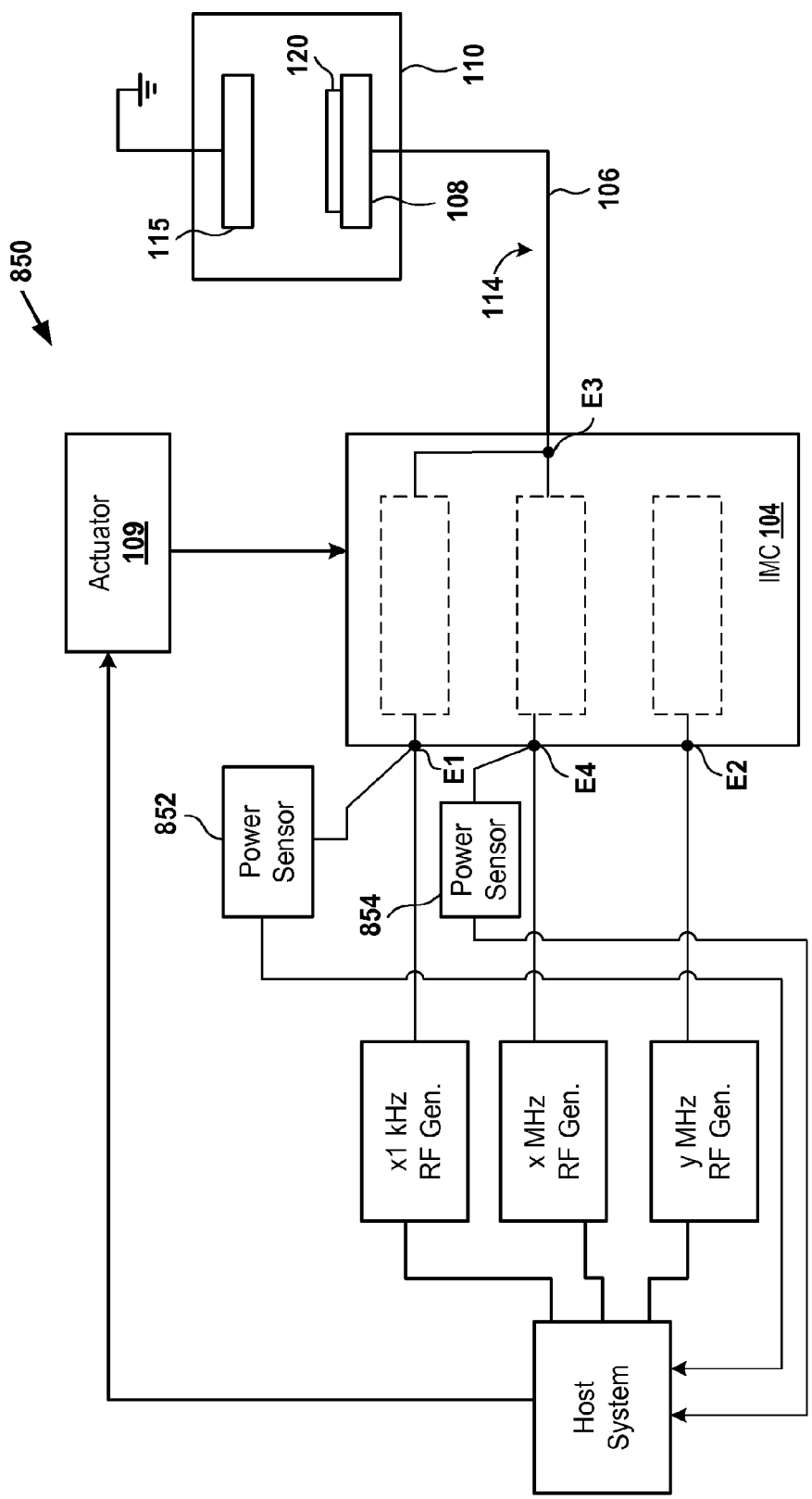
FIG. 8F is a block diagram of an embodiment of a plasma system to illustrate use of a UCC to control an amount of isolation of an RF signal transferred via a circuit, within an IMC, from an RF signal transferred via another circuit, within the IMC.

FIG. 8F is a block diagram of an embodiment of a plasma system 850 to illustrate use of the UCC 103 to control an amount of isolation, measured in decibels, of an RF signal transferred via a circuit, within the IMC 104, connected between the ends E1 and E3 from an RF signal transferred via a circuit, within the IMC 104, connected between the ends E4 and E3. The plasma system 840 is similar to the plasma system 100 (FIG. 1A) except that the plasma system 830 includes a power sensor 852, e.g., a power measurement probe, etc., that is connected to the end E1 and includes a power sensor 854 that is connected to the end E4.

While processing the substrate 120 within the plasma chamber 110, the power sensor 852 measures an amount of power being transferred at the end E1. The power sensor 852 provides the measured amount of power to the processor of the host system. Moreover, the power sensor 854 measures an amount of power being transferred at the end E4. The power sensor 854 provides the measured amount of power to the processor of the host system.

The processor of the host system calculates a difference between the amount of power measured at the end E1 and the amount of power measured at the end E4, and compares the difference to the pre-determined amount of isolation. Upon determining that the calculated difference is not within the pre-determined threshold of the pre-determined amount of isolation, the processor of the host system identifies an amount of current to be generated by the driver of the actuator 109. The amount of current corresponds to a capacitance of the UCC 103. Moreover, the capacitance corresponds to an amount of isolation, e.g., the pre-determined amount of isolation, the pre-determined threshold of the pre-determined amount of isolation, etc., to be set or achieved. The amount of current is provided within a command signal from the processor of the host system to the driver of the actuator 109. The driver of the actuator 109 drives the mechanical components of the actuator 109. The mechanical components are actuated to achieve a capacitance of UCC 103. For example, a plate of a capacitor of the UCC 103 is rotated with respect to another plate of the capacitor to achieve a capacitance of the capacitor. As another example, multiple plates of multiple capacitors of the UCC 103 are rotated with respect to corresponding plates of the capacitors to achieve capacitances of the capacitors. The capacitance of the UCC 103 is adjusted to achieve the capacitance that corresponds to the pre-determined threshold of the pre-determined amount of isolation. The adjusted capacitance of the UCC 103 changes an impedance of the IMC 104 so that an RF signal that is supplied from the x1 kHz is modified by the IMC 104 to generate the modified signal 114, which is provided to the chuck 108 for processing the substrate 120.

In one embodiment, the processor of the host system identifies a capacitance that corresponds an amount of isolation to be achieved between the ends E1 and E4, and provides the capacitance to the display device of the host system for display. The user views the display device and changes one or more capacitors of the UCC 103 to achieve the capacitance of the UCC 103 that is displayed on the display device so that isolation between the ends E1 and E4 is within the pre-determined threshold of the pre-determined amount of isolation.

In an embodiment, when the x1 kHz RF generator and the y MHz RF generator are used, the power sensor 854 is connected to the end E2 and the capacitance of the UCC 103 is controlled is a manner similar to that described in the embodiments above so that isolation between the ends E1 and E3 is within a pre-determined threshold of a pre-determined amount of isolation.

In one embodiment, a level of a parameter includes one or more amounts of the level. For example, a pre-determined level of delivered power includes one or more amounts of delivered power within the pre-determined threshold of the pre-determined amount of delivered power. As another example, a pre-determined level of isolation includes one or more amounts of isolation within the pre-determined threshold of the pre-determined amount of isolation.

Figure 9:
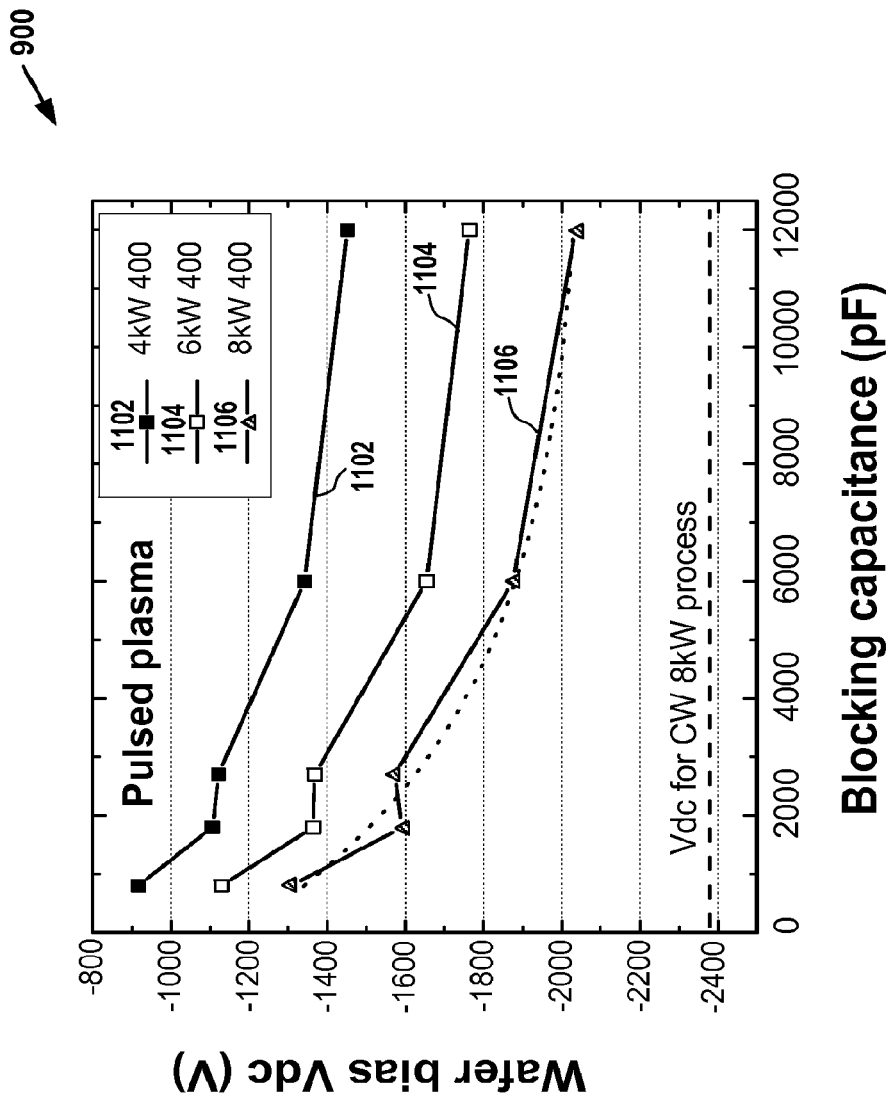
FIG. 9 is an embodiment of a graph to illustrate a relationship between wafer DC bias and capacitance of a UCC for different amounts of power of RF signals that are generated by the x1 kHz RF generator.

FIG. 9 is an embodiment of a graph 900 to illustrate a relationship between wafer DC bias and capacitance of the UCC 103 (FIG. 1A) for difference amounts of power of RF signals that are generated by the x1 kHz RF generator. As shown by plots 1102, 1104, and 1106, with an increase in capacitance, there is an increase in an amount of wafer DC bias, measured in volts. For example, wafer DC bias increases from −900 volts to −1400 volts with an increase in capacitance of the UCC 103 from about 800 picoFarads (pF) to 12000 pF when the x1 kHz supplies 4 kW of power. As another example, wafer DC bias increases by −700 volts with an increase in capacitance of the UCC 103 from about 800 pF to 12000 pF when the x1 kHz supplies 8 kW of power.

FIG. 10A is an embodiment of a graph 1000 to illustrate an increase in RF rod potential, measured in kilovolts (kVs), with an increase in capacitance of the UCC 103 (FIG. 1A), during the state S0 of the RF signal generated by the x1 kHz RF generator. For example, during the state S0 of the RF signal generated by the x1 kHz RF signal, there is an increase in a negative amount of RF rod potential at the RF transmission line 106 (FIG. 1A). Such a decrease is illustrate by plots 1002 and 1004. The plot 1004 is plotted when a capacitance of the UCC 103 is 800 pF and the plot 1002 is plotted when a capacitance of the UCC 103 is 6 nanoFarads (nF). The graph 1000 plots RF rod potential versus time t. A zoom-in of the plots 1202 and 1204 during the state S0 is illustrated in a graph 1006, which plots RF rod potential versus time t. Also, as shown in an embodiment of a graph 1008 of FIG. 10C, there is minimal or no change in RF rod potential during the state S1 when a capacitance of the UCC 103 increases from 800 pF to 6 nF. The graph 1008 is a zoom-in of the graph 1000 when the RF signal generated by the x1 kHz RF generator is in the state S1.

It should be noted that the graphs 1000, 1006, and 1008 are plotted when the RF signal generated by the x1 kHz RF generator is pulsed, e.g., transitions between the states S1 and S0 periodically, transitions from the state S1 to the state S0 then back to the state S1 and so on, etc. Moreover, the graphs 1000, 1006, and 1008 are plotted when the RF signal generated by the x1 kHz RF generator has a zero power level during the state S0.

In one embodiment, when the RF signal that is generated by the x1 kHz RF generator has a non-zero power level during the state S0, an amount of negative RF rod potential at the RF transmission line 106 increases with an increase in capacitance of the UCC 103.

Figure 10D:
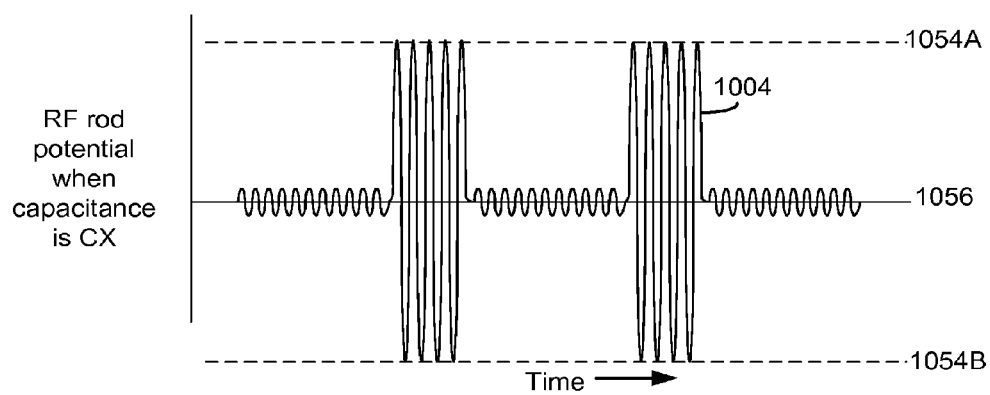
FIG. 10D is an embodiment of a graph to illustrate an RF rod potential at a point on an RF transmission line versus time.

FIG. 10D is an embodiment of a graph to illustrate an RF rod potential 1004 at a point on the RF transmission line 106 (FIG. 1A) versus time. The RF rod potential 1004 is plotted when a capacitance of the UCC 103 (FIG. 1A) is set manually or adjusted via the actuator 109 (FIG. 1A) to a value CX. The RF rod potential 1004 is between a high level 1054A and a low level 1054B during the state S1. Moreover, the RF rod potential 1004 is at a level 1056 during the state S0.

Figure 10E:
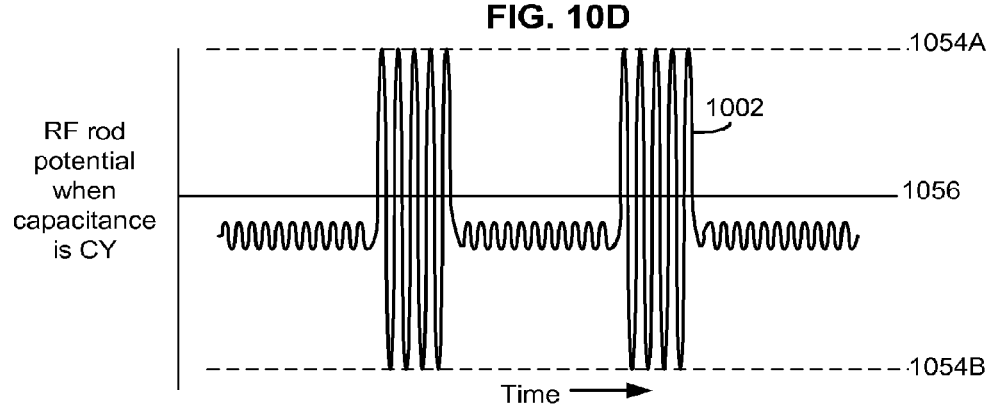
FIG. 10E is an embodiment of a graph to illustrate a comparison between the RF rod potential of FIG. 10D and an RF rod potential when a capacitance of the UCC is changed.

FIG. 10E is an embodiment of a graph to illustrate a change in an RF rod potential with a change in a capacitance of the UCC 103 (FIG. 1A). The graph plots an RF rod potential 1002 at a point on the RF transmission line 106 (FIG. 1A) versus time. The RF rod potential 1002 is plotted when a capacitance of the UCC 103 (FIG. 1A) is set manually or adjusted via the actuator 109 (FIG. 1A) to a value CY, which is greater than the value CX, referred to above using FIG. 10D. During the state S1, the RF rod potential 1002 is between the high level 1054A and the low level 1054B. Moreover, during the state S0, the RF rod potential 1002 is below a level 1056 as a result of the increase in capacitance of the UCC 103 from CX to CY.

Figure 10F:
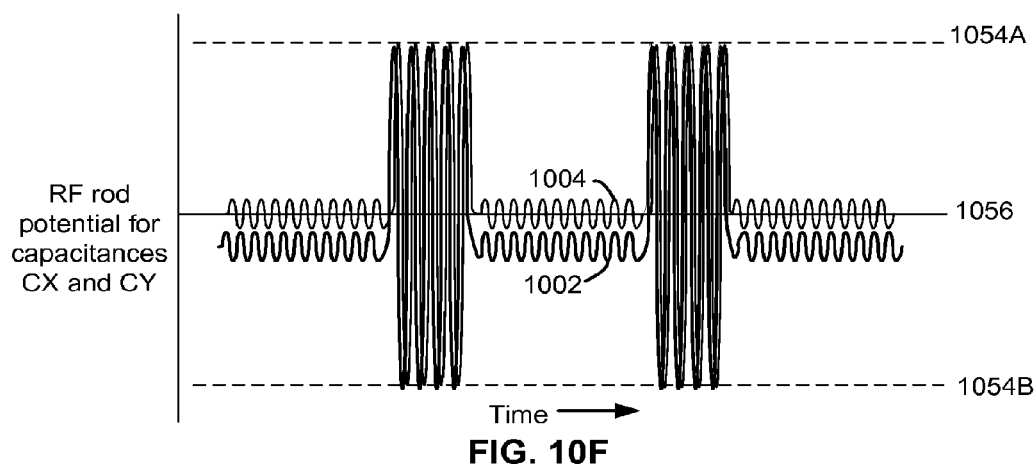
FIG. 10F is an embodiment of a graph to illustrate a comparison between the RF rod potential of FIG. 10D and the RF rod potential of FIG. 10E.

FIG. 10F is an embodiment of a graph to illustrate a comparison between the RF rod potential 1004 and the RF rod potential 1002. The graph plots the RF rod potential 1004 versus time and the RF rod potential 1002 versus time. Differences between the RF rod potentials 1004 and 1002 are visible in FIG. 10F. It should be noted that in one embodiment, with an increase in a negative amount of RF rod potential, there is an increase in density of ions of plasma within the plasma chamber 110 (FIG. 1).

Figure 11:
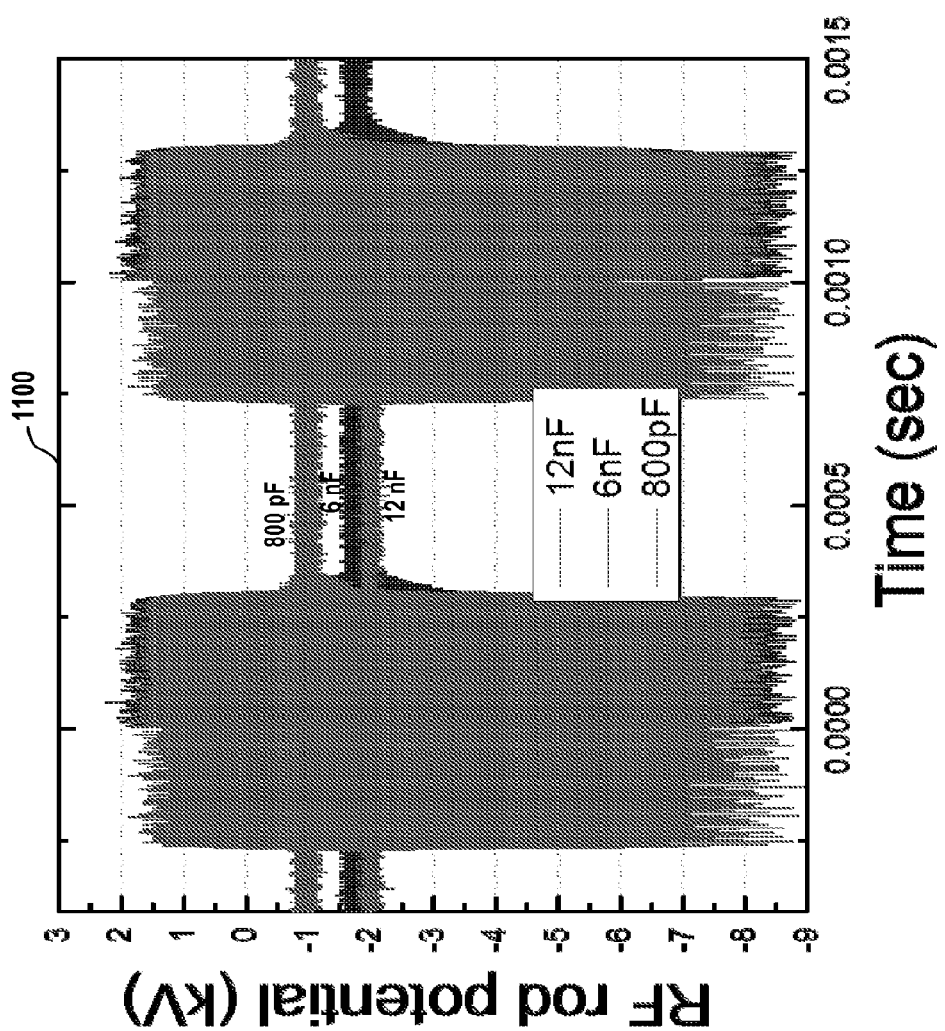
FIG. 11 is a diagram of a graph to illustrate that an RF rod potential at an RF transmission line increases with an increase in capacitance of a UCC.

FIG. 11 is a diagram of an embodiment of a graph 1100 to illustrate that an RF rod potential at the RF transmission line 106 (FIG. 1A) increases with an increase in capacitance of the UCC 103 (FIG. 1A). The RF rod potential is plotted versus time. From the graph 1100, it is noted that the RF rod potential increases negatively when a capacitance of the UCC 103 increases from 800 pF to 6 nF and further to 12 nF.

Figure 12:
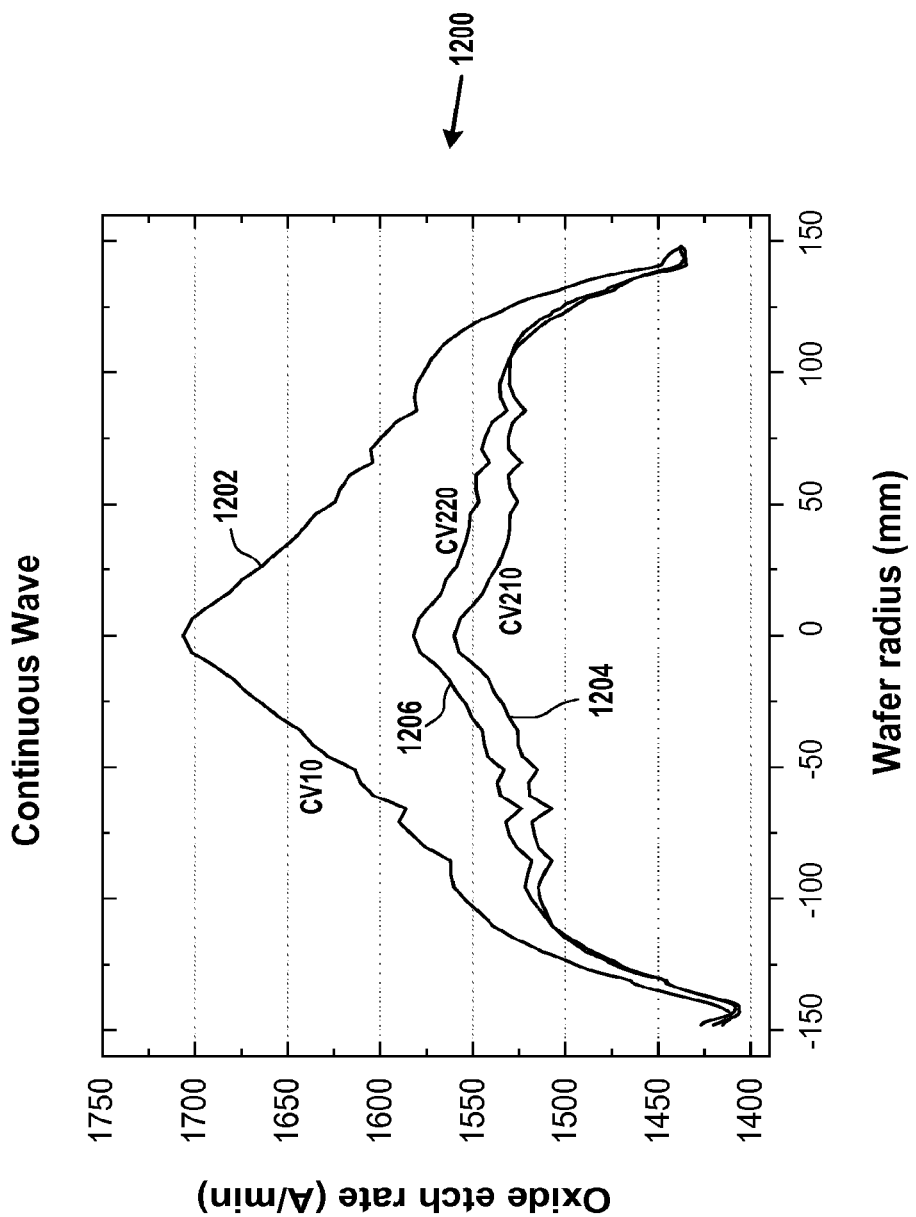
FIG. 12 is an embodiment of a graph to illustrate that an oxide etch rate at a center region within a plasma chamber is controlled by controlling a capacitance of a UCC when the x1 kHz RF generator generates a continuous wave signal.

FIG. 12 is an embodiment of a graph 1200 to illustrate that an oxide etch rate at a center region within the plasma chamber 110 (FIG. 1A) is controlled by controlling a capacitance of the UCC 103 (FIG. 1A) when the x1 kHz RF generator generates a continuous wave signal, which is not a pulsed signal. The graph 1200 plots an etch rate of etching an oxide on the substrate 120 versus a radius of the substrate 120. Capacitance of the UCC 103 is varied between values CV1 and CV210 or CV220 to change an etch rate at the center region. The values CV210 and CV220 are equal to each other.

In an embodiment, the center region is defined as a region between the upper electrode 115 (FIG. 1A) and the chuck 108 (FIG. 1A). In one embodiment, a center of the substrate 120 (FIG. 1A) coincides with a center of the chuck 108. Moreover, an edge region within the plasma chamber 110 is defined as a region that is not under the upper electrode 115 and not over the chuck 108. The edge region is closer to a C-shroud of the plasma chamber 110 than the center region. For example, the edge region is surrounded by the C-shroud, an upper electrode extension that surrounds the upper electrode 115, a lower electrode extension that surrounds the chuck 108, and the center region.

The graph 1200 includes a plot 1202 of an etch rate profile, a plot 1204 of an etch rate profile, and a plot 1206 of an etch rate profile. The plot 1202 is generated when two RF generators, e.g., the x1 kHz RF generator and the y MHz RF generator, etc., are used to generate RF signals and the capacitance of the UCC 103 is CV10. Moreover, the plot 1204 is generated when two RF generators, e.g., the x1 kHz RF generator and the y MHz RF generator, etc., are used to generate RF signals and the capacitance of the UCC 103 is CV210. Furthermore, plot 1206 is generated when three RF generators, e.g., the x1 kHz RF generator, the x MHz RF generator, and the y MHz RF generator, etc., are used to generate RF signals and the capacitance of the UCC 103 is CV220. It should be noted that the capacitance CV210 is the same as the capacitance CV220. As seen from the plots 1204 and 1206, a change in a number of RF generators does not have or has a minimal effect on an etch rate profile when a capacitance of the UCC 103 is the same. Moreover, as seen from the plots 1202 and 1204 or from the plots 1202 and 1206, a change in a capacitance of the UCC 103 from CV10 to CV210 or from CV10 to CV220 affects an etch rate profile for etching the substrate 120 (FIG. 1A).

Figure 13A:
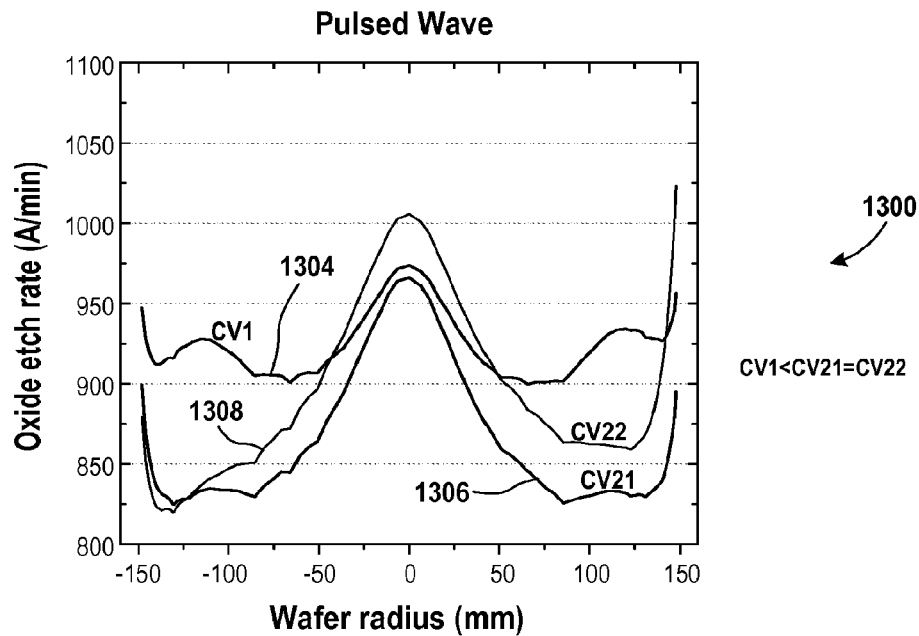
FIG. 13A is an embodiment of a graph to illustrate a change in an etch rate with a change in a capacitance of a UCC.

FIG. 13A is an embodiment of a graph 1300 to illustrate a change in an etch rate with a change in a capacitance of the UCC 103 (FIG. 1A). The graph 1300 is an etch rate profile of etching the substrate 120 (FIG. 1) in the plasma chamber 110 (FIG. 1). The graph 1300 plots an etch rate of etching an oxide on the substrate 120 (FIG. 1A) versus a radius of the substrate 120. The graph 1300 is plotted when the x1 kHz RF generator generates a pulsed RF signal. The graph 1300 includes three plots 1304, 1306, and 1308 of etch rate profiles. As seen from the three plots 1304, 1306, and 1308, when a capacitance of the UCC 103 decreases from CV21 or CV22 to CV1, etch rate of etching the oxide on the substrate 120 becomes more uniform. For example, when the capacitance is CV1, etch rate of etching the oxide is more uniform, especially in the edge region, compared to when the capacitance is CV21 or CV22. The capacitances CV21 and CV22 are equal to each other.

The plot 1304 is generated when two RF generators, e.g., the x1 kHz RF generator and the y MHz RF generator, etc., are used to generate RF signals and the capacitance of the UCC 103 is CV1. Moreover, the plot 1306 is generated when two RF generators, e.g., the x1 kHz RF generator and the y MHz RF generator, etc., are used to generate RF signals and the capacitance of the UCC 103 is CV21. Furthermore, the plot 1308 is generated when three RF generators, e.g., the x1 kHz RF generator, the x MHz RF generator, and the y MHz RF generator, etc., are used to generate RF signals and the capacitance of the UCC 103 is CV22. As seen from the plots 1306 and 1308, a change in a number of RF generators does not have or has a minimal effect on an etch rate profile when a capacitance of the UCC 103 is the same. Moreover, as seen from the plots 1304 and 1306 or from the plots 1304 and 1308, a change in a capacitance of the UCC 103 from CV1 to CV21 or from CV1 to CV22 affects an etch rate profile for etching the substrate 120 (FIG. 1A).

Figure 13B:
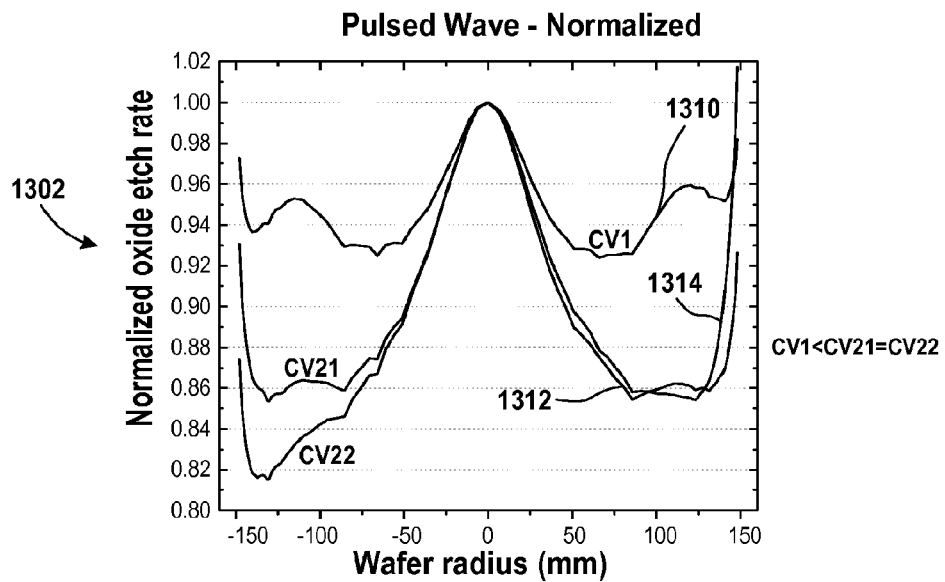
FIG. 13B is a normalized version of the graph of FIG. 13A.

FIG. 13B is an embodiment of a graph 1302 to illustrate a change in an etch rate with a change in a capacitance of the UCC 103 (FIG. 1A). The graph 1302 is similar to the graph 1300 (FIG. 13A) except the etch rate in the graph 1302 is normalized. The graph 1302 includes plots 1310, 1312, and 1314 of etch rate profiles for etching the substrate 120 (FIG. 1A). The plot 1310 is a normalized version of the plot 1304 (FIG. 13A), the plot 1312 is a normalized version of the plot 1306 (FIG. 13A), and the plot 1314 is a normalized version of the plot 1308 (FIG. 13A). It is visible from the plots 1312 and 1314 that a change in a number of RF generators does not have or has a minimal effect on an etch rate profile when a capacitance of the UCC 103 is the same. Moreover, it is visible from the plots 1310 and 1312 or the plots 1310 and 1314 that a change in a capacitance of the UCC 103 from CV1 to CV21 or from CV1 to CV22 affects an etch rate profile for etching the substrate 120.

In one aspect, some of the embodiments, described herein, are practiced with various computer system configurations including hand-held hardware units, microprocessor systems, microprocessor-based or programmable consumer electronics, minicomputers, mainframe computers, etc. In an aspect, some of the embodiments, described herein, are practiced in distributed computing environments where tasks are performed by remote processing hardware units that are linked through a computer network.

In various embodiments, a controller is part of a system. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which controls various components or subparts of the system. The controller, depending on processing requirements and/or a type of the system, is programmed to control any process disclosed herein, using a recipe, which includes a process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with the system, or coupled to the system, or otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In various embodiments, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and/or any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A system comprising:
   a kilohertz (kHz) radio frequency (RF) generator for generating and supplying a kHz RF signal;
   a megahertz (MHz) RF generator for generating and supplying a MHz RF signal;
   a first RF cable connected to an output of the kHz RF generator for receiving the kHz RF signal;
   a second RF cable connected to an output of the MHz RF generator for receiving the MHz RF signal;
   an impedance matching circuit coupled to the kHz RF generator via the first RF cable and coupled to the MHz RF generator via the second RF cable, wherein the impedance matching circuit has an output and includes:
      a first circuit including a first plurality of tuning elements located along a path for transferring the kHz RF signal;
      a second circuit including a second plurality of tuning elements for transferring the MHz RF signal, wherein the first and second circuits are coupled to the output; and
      a uniformity control circuit defined from at least one of the first plurality of tuning elements;
   an RF transmission line coupled to the impedance matching circuit; and
   a plasma chamber including an electrode, wherein the electrode is connected to the RF transmission line;
   wherein the uniformity control circuit is located serially along the path of the first circuit to define a capacitance to adjust a radial uniformity profile of an etch rate produced using the plasma chamber, to provide a pre-determined level of isolation from the MHz RF signal, and to achieve a pre-determined level of power delivered by the kHz RF generator to the electrode of the plasma chamber.

2. The system of claim 1, wherein the first circuit is coupled to a probe via the first RF cable, wherein the probe is used to calculate an amount of power that is delivered via the first circuit, wherein the amount of power delivered via the first circuit and the pre-determined level of power delivered by the kHz RF generator are used to set the capacitance of the uniformity control circuit.

3. The system of claim 1, wherein the first circuit is coupled to a first power sensor, wherein the second circuit is coupled to a second power sensor, wherein the first and second power sensors are used to calculate an amount of isolation of the kHz RF signal transferred via the first circuit from the MHz RF signal transferred via the second circuit, wherein the amount of isolation calculated and the pre-determined level of isolation are used to set the capacitance of the uniformity control circuit.

4. The system of claim 1, wherein the first circuit includes one or more series circuit elements and one or more shunt circuit elements, wherein the second circuit includes one or more series circuit elements and one or more shunt circuit elements, wherein the uniformity control circuit is coupled serially with the one or more series circuit elements of the first circuit, wherein the uniformity control circuit does not include a shunt circuit element.

5. The system of claim 1, wherein remaining tuning elements of the first plurality of tuning elements not used to define the uniformity control circuit have a plurality of characteristics that are configured to be adjusted after the capacitance of the uniformity control circuit is defined, wherein the plurality of characteristics of the remaining tuning elements are adjusted to provide the pre-determined level of isolation from the MHz RF signal transferred through the second circuit and achieve the pre-determined level of power to be delivered to the electrode of the plasma chamber.

6. The system of claim 1, wherein the uniformity control circuit includes one or more capacitors having a capacitance ranging from 600 picoFarads to 15000 picoFarads, wherein the kHz RF generator is configured to operate in a range from 50 kHz to 1000 kHz.

7. The system of claim 1, wherein the uniformity control circuit includes a variable capacitor, wherein the capacitance is controlled by a host system via an actuator.

8. The system of claim 1, wherein the uniformity control circuit includes a fixed capacitor.

9. A method comprising:
generating a kilohertz (kHz) radio frequency (RF) signal;
generating a megahertz (MHz) RF signal;
transferring the kHz RF signal via a first circuit of an impedance matching network;
transferring the MHz RF signal via a second circuit of the impedance matching network;
combining the kHz RF signal with the MHz RF signal to generate a modified RF signal;
sending the modified RF signal via an RF transmission line to an electrode of a plasma chamber; and
adjusting a radial uniformity profile of an etch rate associated with the plasma chamber based on a capacitance of an uniformity control circuit of the first circuit;
achieving a pre-determined level of isolation from the MHz RF signal based on the capacitance; and
achieving a pre-determined level of power delivered using the kHz RF signal based on the capacitance.

10. The method of claim 9, further comprising receiving an amount of power that is delivered via the first circuit, wherein the capacitance is based on the amount of power delivered via the first circuit and the pre-determined level of power delivered using the kHz RF signal.

11. The method of claim 9, further comprising receiving an amount of isolation of the kHz RF signal transferred via the first circuit from the MHz RF signal transferred via the second circuit, wherein the capacitance is based on the amount of isolation received and the pre-determined level of isolation.

12. The method of claim 9,
receiving an amount of power that is delivered via the first circuit, wherein the amount of power delivered and the pre-determined level of power delivered are used to set the capacitance of the uniformity control circuit,
receiving an amount of power that is transferred via the first circuit;
receiving an amount of power that is transferred via the second circuit;
determining an amount of isolation of the kHz RF signal transferred via the first circuit from the MHz RF signal transferred via the second circuit based on the respective amounts of power transferred via the first and second circuits, wherein the capacitance is based on the amount of isolation and the pre-determined level of isolation.

13. The method of claim 9, wherein the first circuit includes one or more series circuit elements and one or more shunt circuit elements, wherein the second circuit includes one or more series circuit elements and one or more shunt circuit elements, wherein the uniformity control circuit is coupled serially with the one or more series circuit elements of the first circuit, wherein the uniformity control circuit does not include a shunt circuit element.

14. The method of claim 9, wherein the first circuit includes a plurality of tuning elements, the plurality of tuning elements including the uniformity control circuit and remaining tuning elements, the method further comprising:
adjusting a plurality of characteristics of the remaining tuning elements to provide the pre-determined level of isolation from the MHz RF signal transferred via the second circuit and achieve the pre-determined level of power to be delivered to the electrode of the plasma chamber, wherein said adjusting the plurality of characteristics of the remaining tuning elements is performed after the capacitance of the uniformity control circuit is set.

15. A method comprising:
controlling a characteristic of a uniformity control circuit to achieve a radial uniformity in an etch rate, wherein the uniformity control circuit is a part of a first circuit, wherein the first circuit includes a first plurality of tuning elements, wherein the first plurality of tuning elements includes remaining tuning elements, wherein the first circuit has an input coupled to a kilohertz (kHz) radio frequency (RF) generator, wherein the first circuit has an output that is coupled to a second circuit having a second plurality of tuning elements, wherein the second circuit has an input coupled to a megahertz (MHz) RF generator, wherein respective outputs of the first and second circuits are coupled to an input of an RF transmission line, wherein an output of the RF transmission line is coupled to an electrode of a plasma chamber,
adjusting characteristics of the remaining tuning elements of the first circuit after controlling the characteristic of the uniformity control circuit, wherein adjusting the characteristics of the remaining tuning elements is performed to provide a pre-determined level of isolation from a MHz RF signal transferred via the second circuit and achieve a pre-determined level of power to be delivered to the electrode of the plasma chamber.

16. The method of claim 15, further comprising further controlling the characteristic of the uniformity control circuit to provide the pre-determined level of isolation from the MHz RF signal transferred via the second circuit and achieve the pre-determined level of power delivered to the electrode of the plasma chamber, wherein said further controlling is performed simultaneously with adjusting the characteristics of the remaining tuning elements.

17. The method of claim 15, wherein the uniformity control circuit has a capacitance, the method further comprising:
   calculating an amount of power that is delivered via the first circuit to the plasma chamber, wherein controlling the characteristic of the uniformity control circuit and adjusting the characteristics of the remaining tuning elements are performed so that there is a match between the amount of power delivered and the pre-determined level of power; and
   calculating an amount of isolation from the MHz RF signal transferred via the second circuit, wherein controlling the characteristic of the uniformity control circuit and adjusting the characteristics of the remaining tuning elements are performed so that there is a match between the amount of isolation calculated and the pre-determined level of isolation.

18. The method of claim 17, wherein the amount of isolation is calculated based on information received from a first power sensor coupled to the first circuit and a second power sensor coupled to the second circuit.

* * * * *